United States Patent [19]
Sakui et al.

[11] Patent Number: 5,060,194
[45] Date of Patent: Oct. 22, 1991

[54] SEMICONDUCTOR MEMORY DEVICE HAVING A BICMOS MEMORY CELL

[75] Inventors: Koji Sakui; Tsuneaki Fuse, both of Tokyo; Takehiro Hasegawa, Tamar; Shigeyoshi Watanabe; Fujio Masuoka, both of Yokohama, all of Japan

[73] Assignee: Kabushiki Kaisha Toshiba, Kawasaki, Japan

[21] Appl. No.: 501,865

[22] Filed: Mar. 28, 1990

[30] Foreign Application Priority Data

Mar. 31, 1989 [JP] Japan .................................. 1-83575
Jul. 17, 1989 [JP] Japan .................................. 1-184238

[51] Int. Cl.$^5$ ...................... G11C 11/34; H01L 29/72
[52] U.S. Cl. .................................. 365/177; 365/225.6; 357/34; 357/43
[58] Field of Search ...................... 365/177, 225.6, 222; 357/34, 43

[56] References Cited

U.S. PATENT DOCUMENTS

| | | | |
|---|---|---|---|
| 3,827,034 | 7/1974 | Colaco | 357/43 |
| 4,037,243 | 7/1977 | Hoffman et al. | 357/43 |
| 4,090,254 | 5/1978 | Ho et al. | 365/177 |
| 4,276,616 | 6/1981 | Hennig | 365/177 |
| 4,323,986 | 4/1982 | Malaviva | 365/177 |
| 4,395,723 | 7/1983 | Harari | 365/177 |
| 4,408,304 | 10/1983 | Nishizawa et al. | 357/43 |
| 4,431,305 | 2/1984 | Malaviya | 357/43 |
| 4,677,589 | 6/1987 | Haskell et al. | 365/177 |
| 4,791,611 | 12/1988 | Eldin et al. | 365/177 |
| 4,849,934 | 7/1989 | Yokoyama et al. | 365/177 |
| 4,901,127 | 2/1990 | Chow et al. | 357/43 |

Primary Examiner—Joseph A. Popek
Assistant Examiner—Michael A. Whitefield
Attorney, Agent, or Firm—Oblon, Spivak, McClelland, Maier & Neustadt

[57] ABSTRACT

A semiconductor memory device includes a plurality of memory cells each having a bipolar transistor whose collector-emitter voltage $V_{CE}$ is controlled according to the base potential to satisfy the condition of $I_{BE} < I_{CB}$ when the forward base current in the base-emitter path and the reverse base current in the collector-base path are respectively expressed by $I_{BE}$ and $I_{CB}$ and a switching element connected to the bipolar transistor, word lines, bit lines and emitter electrode lines connected to the memory cells, and functions as a dynamic memory cell in the data storing operation and as a gain memory cell in the readout operation.

21 Claims, 22 Drawing Sheets

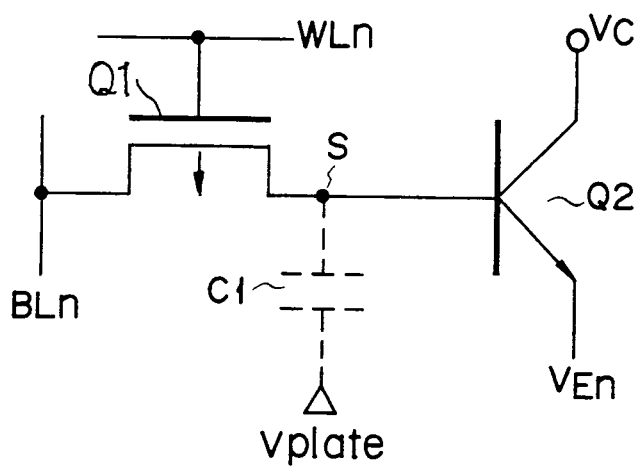
F I G. 10
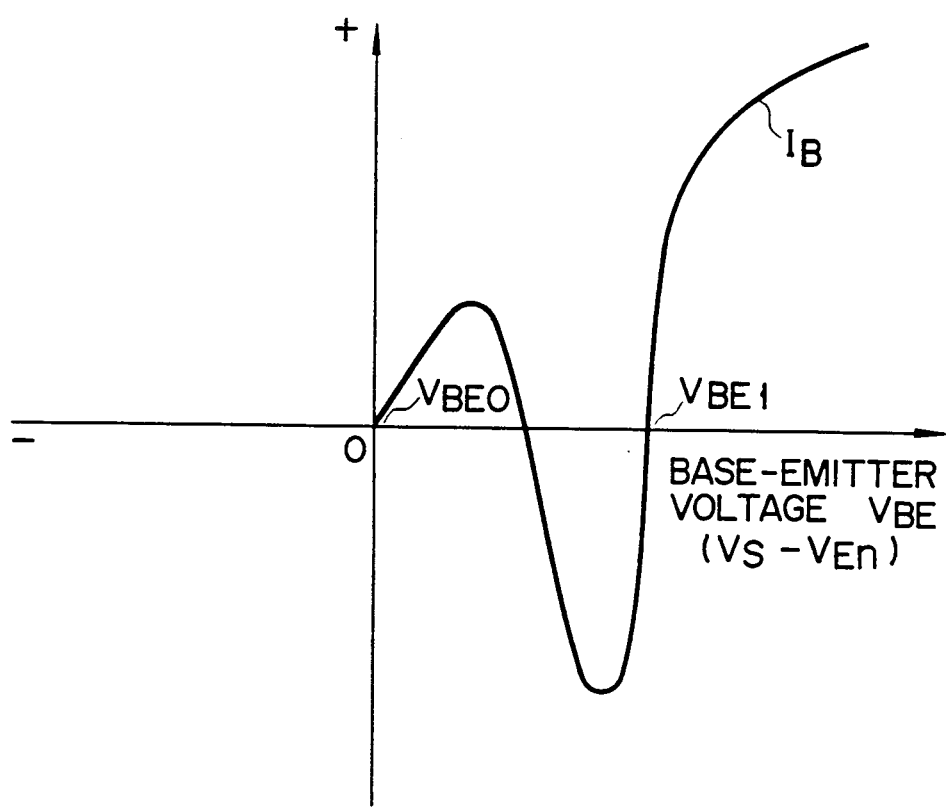
F I G. 11

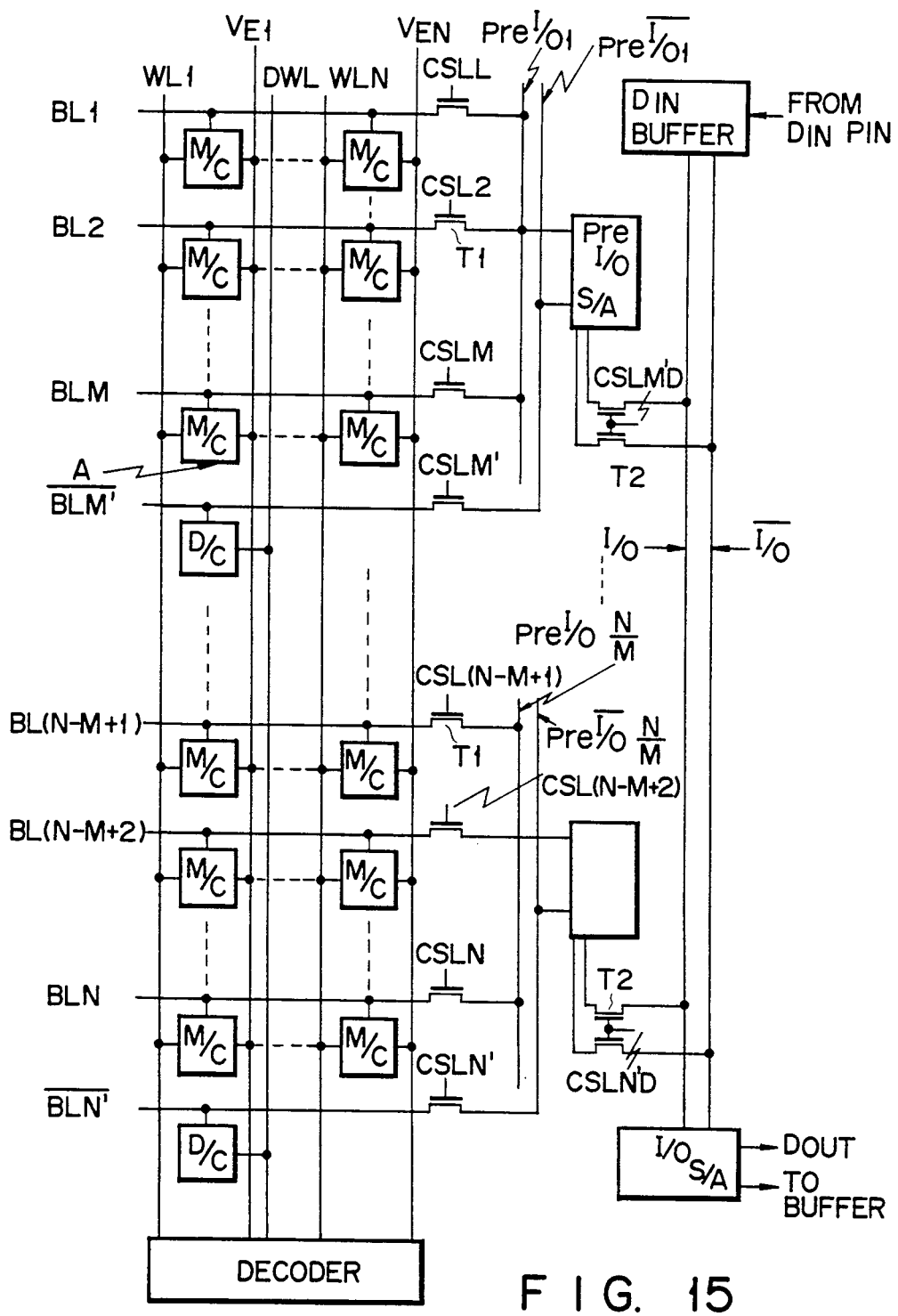
F I G. 15

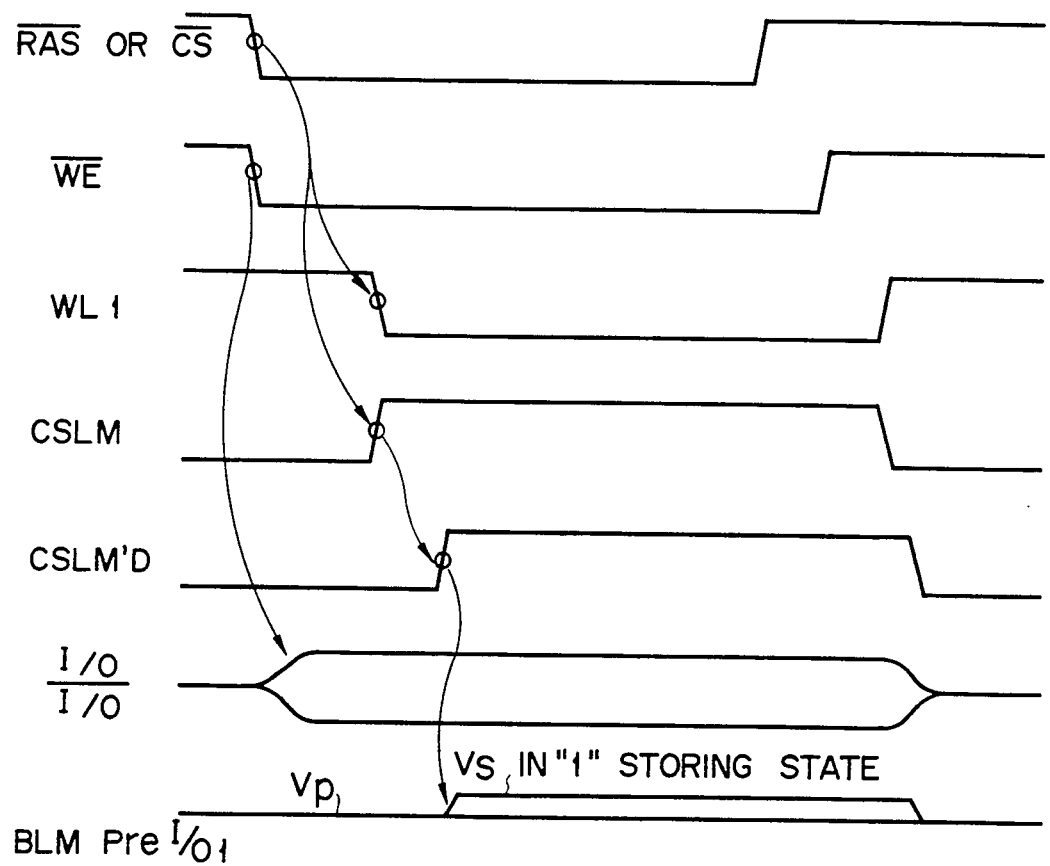
F I G. 17

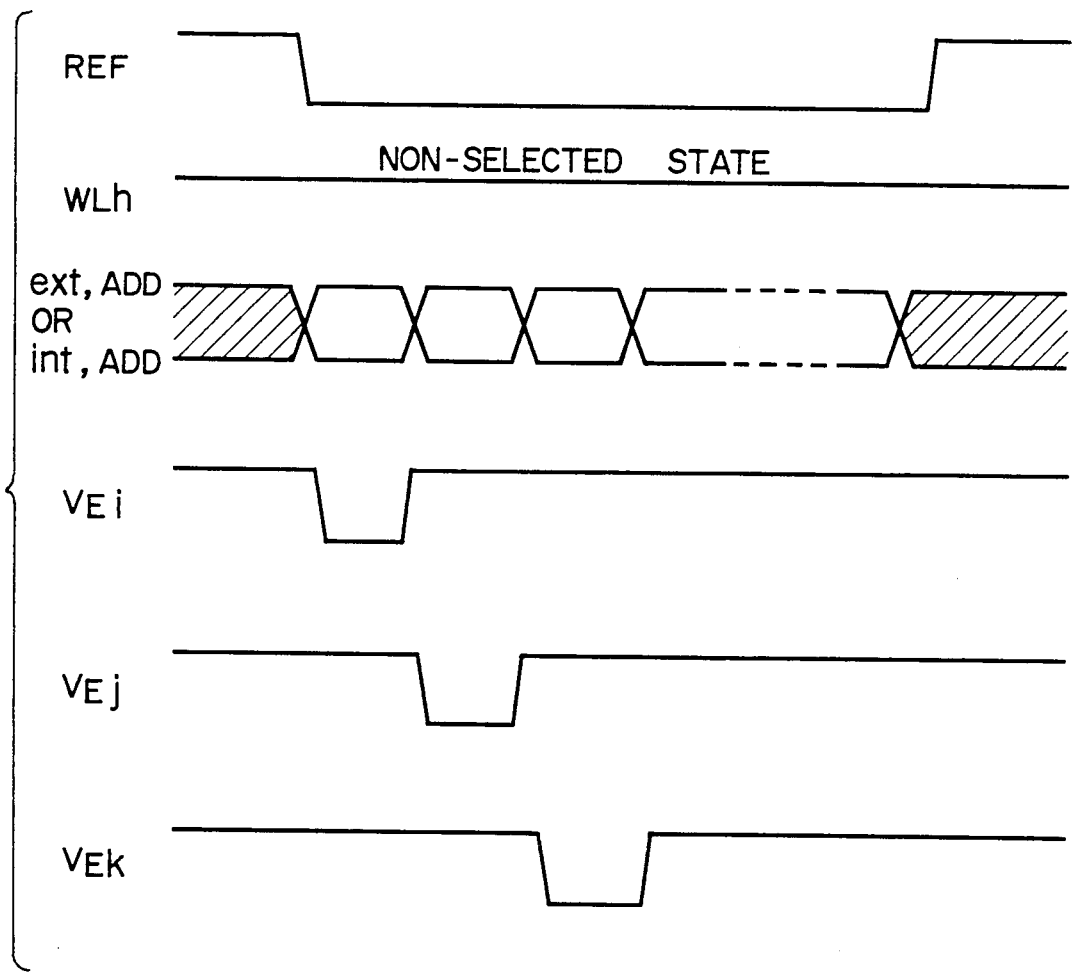
F I G. 18

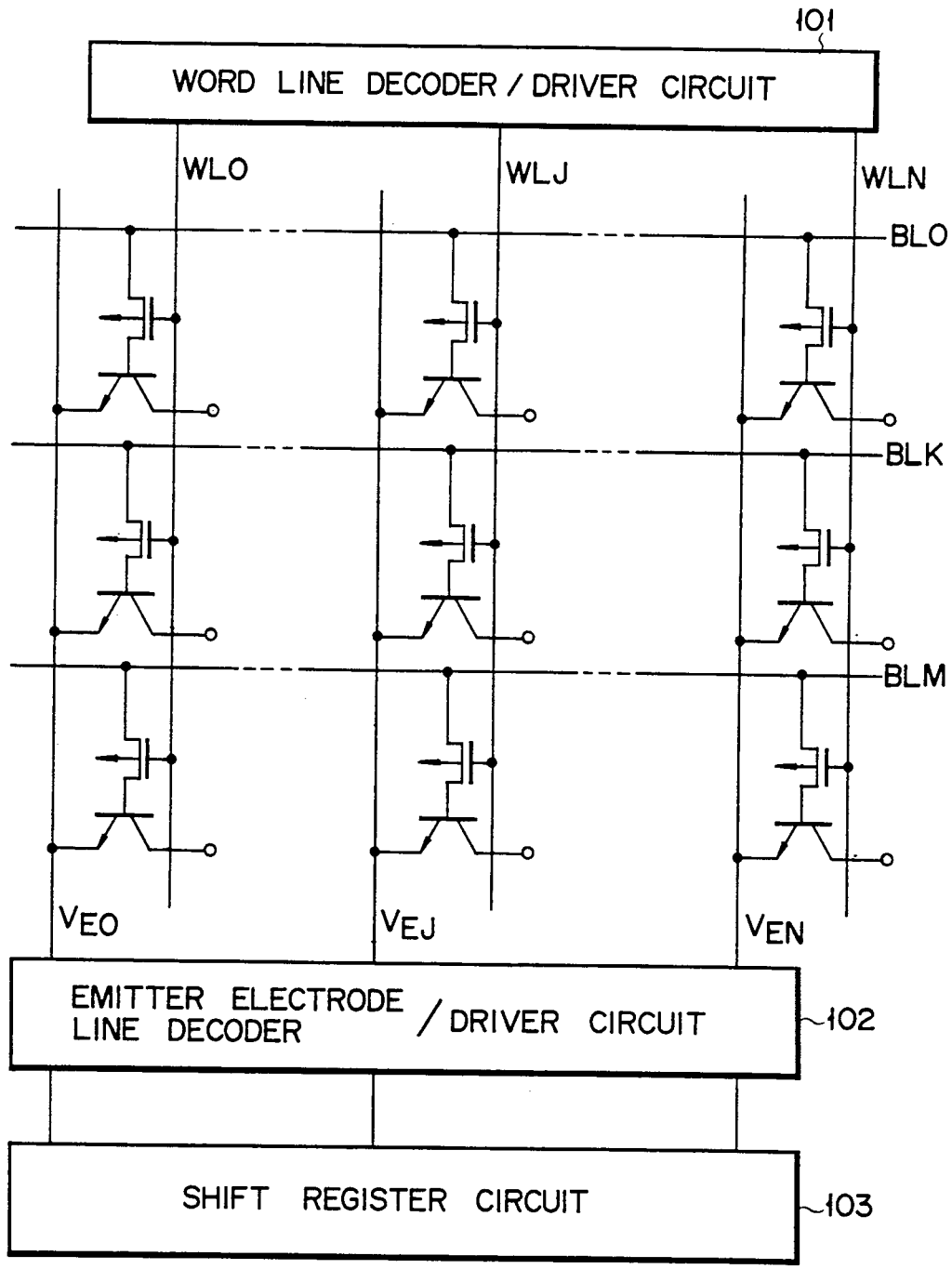
F I G. 20

|  | A0 | A1 | A2 | A3 |  |  | A0 | A1 | A2 | A3 |
|---|---|---|---|---|---|---|---|---|---|---|
| VE00 | 0 | 0 | 0 | 0 |  | VE20 | 0 | 0 | 0 | 1 |
| VE01 | 1 | 0 | 0 | 0 |  | VE21 | 1 | 0 | 0 | 1 |
| VE02 | 0 | 1 | 0 | 0 |  | VE22 | 0 | 1 | 0 | 1 |
| VE03 | 1 | 1 | 0 | 0 |  | VE23 | 1 | 1 | 0 | 1 |
| VE10 | 0 | 0 | 1 | 0 |  | VE30 | 0 | 0 | 1 | 1 |
| VE11 | 1 | 0 | 1 | 0 |  | VE31 | 1 | 0 | 1 | 1 |
| VE12 | 0 | 1 | 1 | 0 |  | VE32 | 0 | 1 | 1 | 1 |
| VE13 | 1 | 1 | 1 | 0 |  | VE33 | 1 | 1 | 1 | 1 |

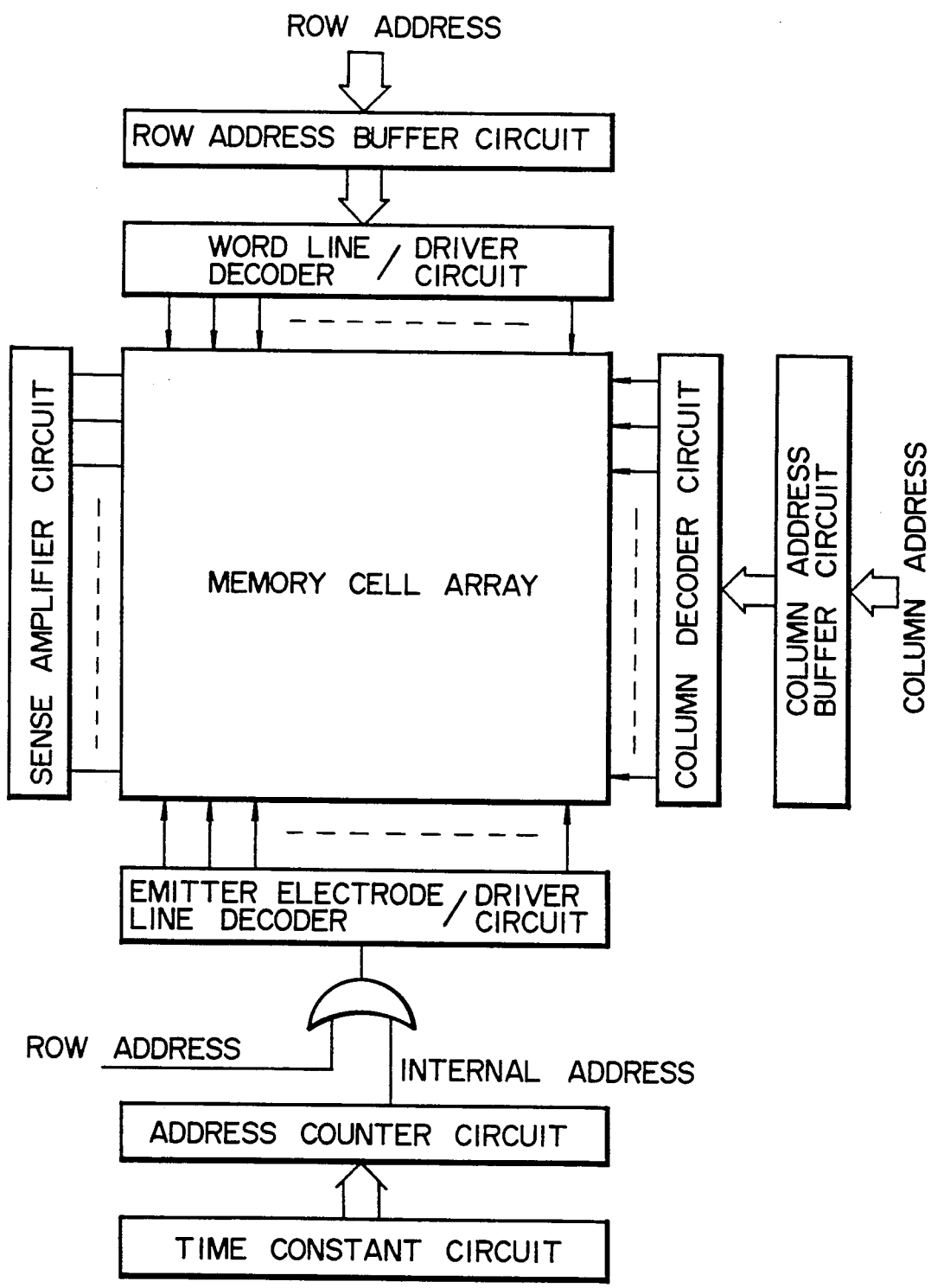
F I G. 23

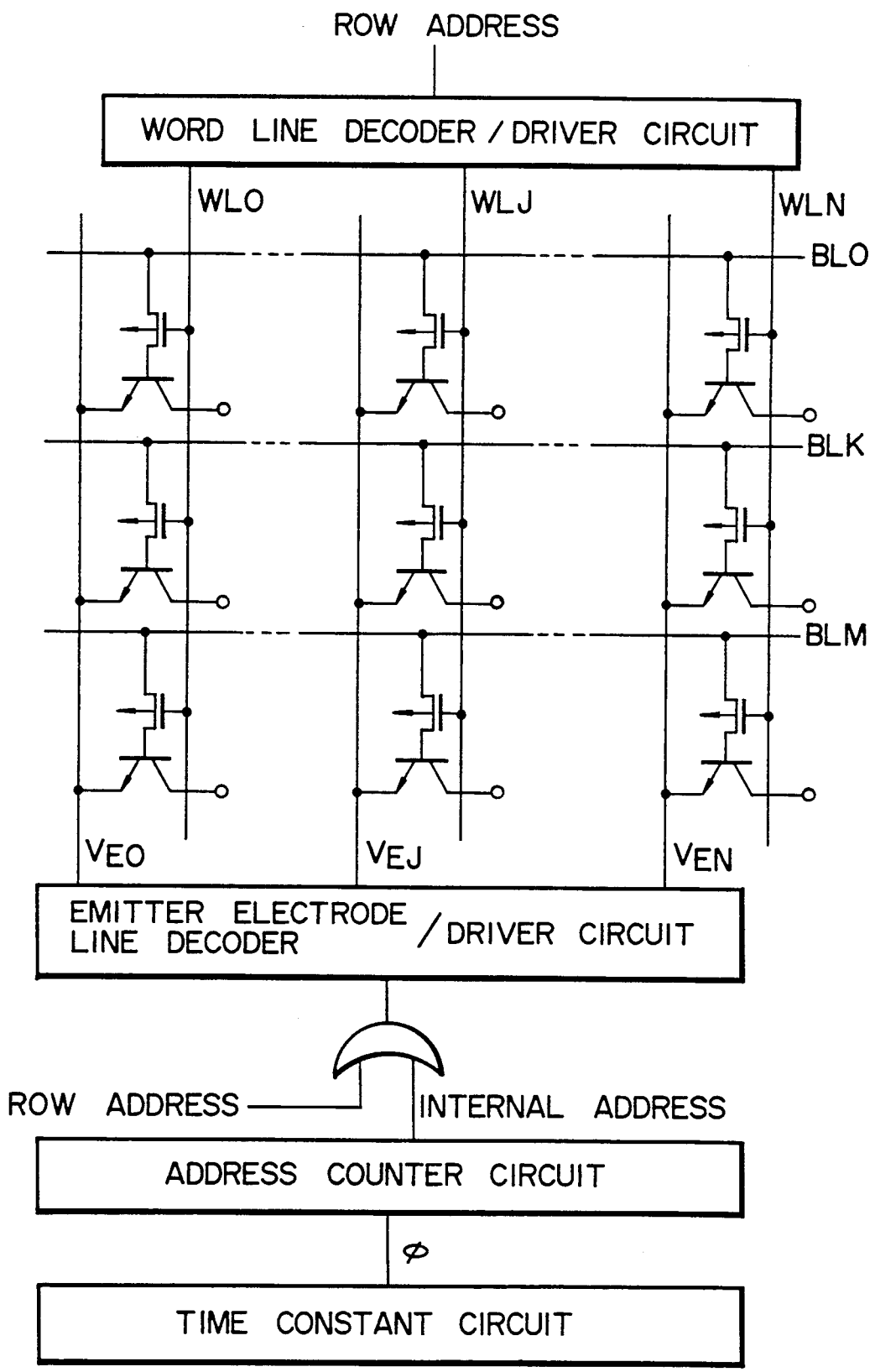
F I G. 24

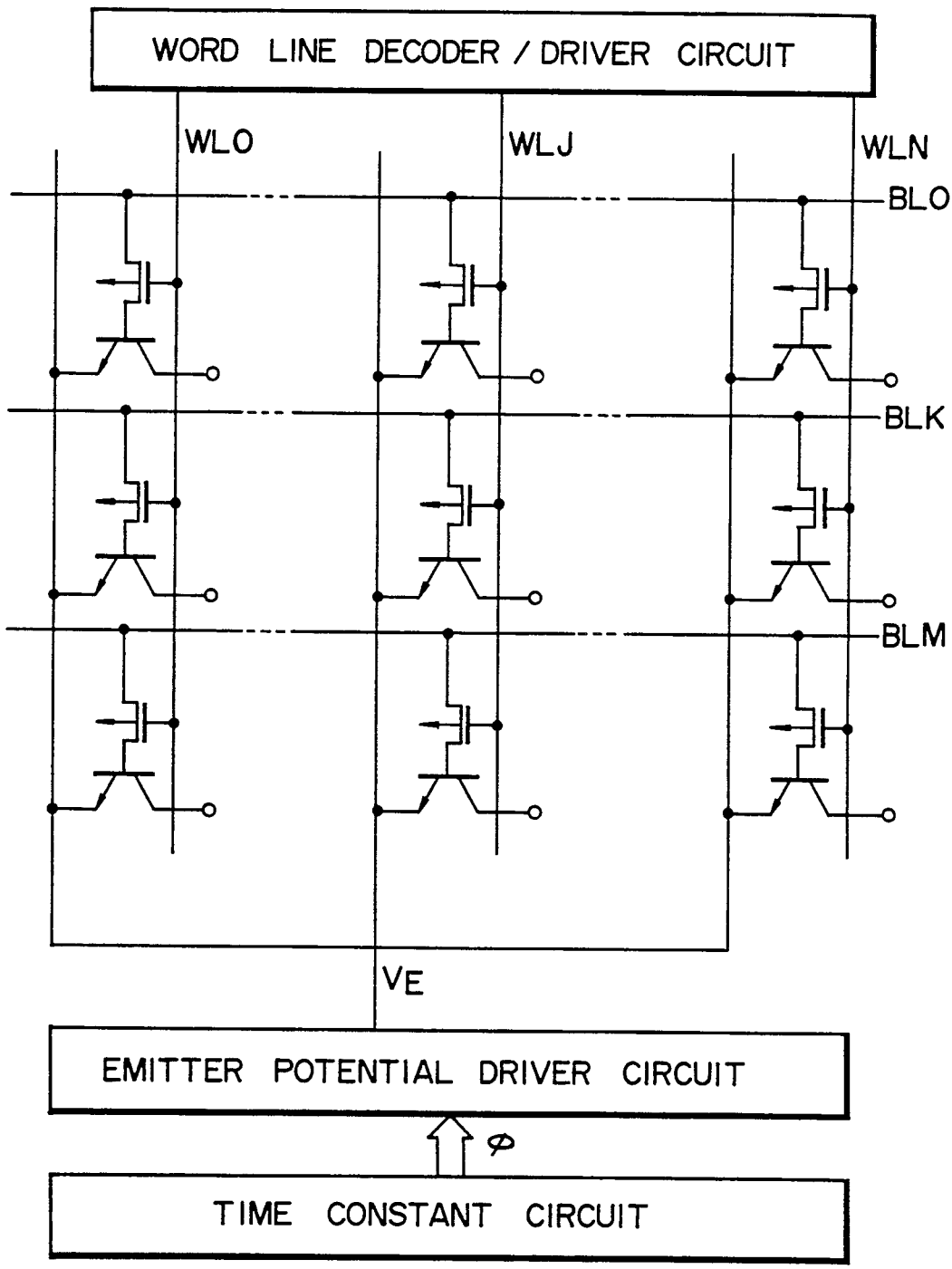
F I G. 27

SEMICONDUCTOR MEMORY DEVICE HAVING A BICMOS MEMORY CELL

BACKGROUND OF THE INVENTION

1. Field of the Invention

This invention relates to a semiconductor memory device having bipolar transistors.

2. Description of the Related Art

Conventionally, a bipolar transistor has been used as a current amplifying element which receives a base current as an input and outputs a collector current. For example, when a positive collector-emitter voltage $V_{CE}$ and base-emitter voltage $V_{BE}$ ($V_{CE} > V_{BE}$) are applied to an NPN bipolar transistor, a collector current $I_C$ takes amplified positive values with respect to various values of base-emitter voltage $V_{BE}$, and in this case, base current $I_B$ is also positive. Since the conventional bipolar transistor described above can only perform a predetermined operation, the application field of this type of bipolar transistor is limited.

SUMMARY OF THE INVENTION

An object of this invention is to provide a semiconductor memory device constituted by using a novel bipolar transistor which can permit forward and reverse base currents to flow depending on a base potential thereof.

An object of this invention is to provide a semiconductor memory device having a bipolar transistor in which collector-emitter voltage $V_{CE}$ is controlled to satisfy $I_{BE} < I_{CB}$ depending on a base potential thereof where $I_{BE}$ and $I_{CB}$ respectively denote a forward base current in the base-emitter path and a reverse base current in the collector-base path and which is connected to a switching element and further having a word line, bit line and emitter electrode line, and functioning as a dynamic memory cell or a gain memory cell in the data storing mode or in the data readout mode, respectively.

According to this invention, there is provided a semiconductor memory device comprising a memory cell array including a plurality of memory cells each having a bipolar transistor whose collector-emitter voltage is controlled to change the polarity of a base current with an increase in a base-emitter voltage and a switching transistor connected between the base of the bipolar transistor and a bit line and controlled by means of a word line; and a voltage-variable element for varying the emitter voltage of the bipolar transistor; wherein the voltage-variable element simultaneously refreshes at least part of the memory cells or all of them by varying the emitter voltage of each memory cell so as to set the PN junction between the base and emitter of the bipolar transistor of each memory cell into the forward bias state for a preset period of time at least once in a predetermined cycle; varies the emitter voltage of the bipolar transistor of that memory cell which is selected by the word line so as to set the PN junction between the base and emitter of the bipolar transistor of the selected memory cell into the forward bias state in the same manner as in the refresh operation in the memory cell data readout mode, thereby causing the memory cell to be operated as a gain cell by utilizing the bipolar transistor characteristic in which the base current is reversed and thus effecting the data readout operation; and varies the emitter voltage of the bipolar transistor of each memory cell so as to set the PN junction between the base and emitter of the bipolar transistor of the memory cell into the reverse bias state in the stand-by mode other than the readout mode in the refresh operation.

In the data readout mode, a reverse base current $I_{CB}$ in the collector-base path which is larger than a forward base current $I_{BE}$ in the base-emitter path can be caused to flow according to variation in the base potential or base-emitter voltage $V_{BE}$ by biasing the PN junction between the base and emitter in a forward direction to set the collector-emitter voltage to a high voltage level, so that the potential attained in the boundary between the forward and reverse base currents can be used as memory information.

Also, in the refresh operation, the magnitude relation between the forward base current $I_{BE}$ in the base-emitter path and the reverse base current $I_{CB}$ in the collector-base path can be determined according to the value of the base potential at the data storing node of the memory cell or the base-emitter voltage $V_{BE}$ by biasing the PN junction between the base and emitter in a forward direction to set the collector-emitter voltage to a high voltage level, and the positive or negative base node is discharged or charged so that the base potential can be set back to a potential corresponding to the potential attained in the boundary between the forward and reverse base currents.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a circuit diagram of a memory cell of a semiconductor memory device according to another embodiment of this invention;

FIG. 11 is an operation characteristic diagram of a bipolar transistor;

FIG. 15 is a diagram showing the layout of a memory cell array and a peripheral circuit;

FIGS. 16 and 17 are clock timing diagrams in the readout mode and write-in mode, respectively;

FIG. 18 is a timing chart of the memory refresh operation;

FIG. 20 is a circuit diagram of a memory device in which a shift register circuit is additionally provided in an emitter electrode line decoder/driver circuit;

FIG. 23 is a block diagram of the semiconductor memory device in which the emitter electrode line and the word line are arranged in parallel;

FIG. 24 is a concrete circuit diagram of the memory cell shown in FIG. 23;

FIG. 27 is a circuit diagram of the memory cell array shown in FIG. 25.

DETAILED DESCRIPTION OF THE PREFERRED EMBODIMENTS

Figure 2:
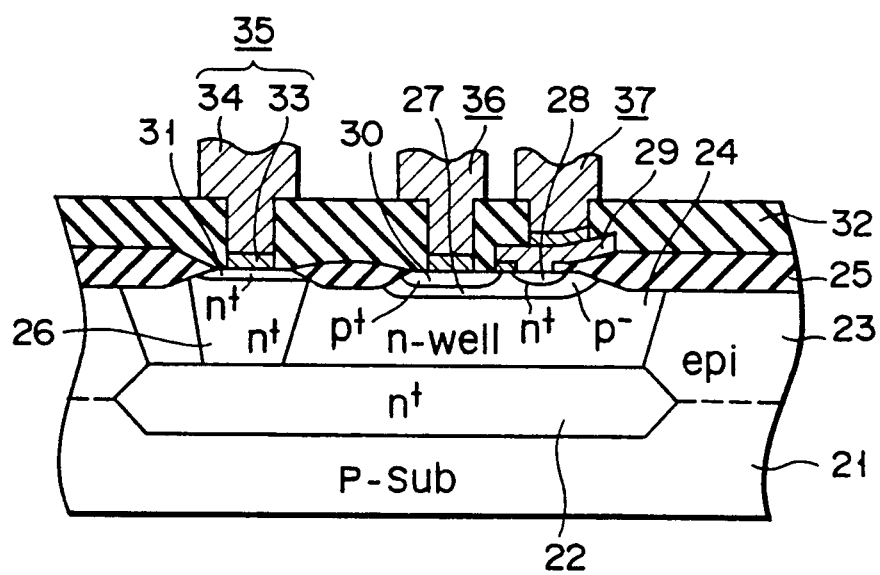
FIG. 2 is a cross sectional view of the bipolar transistor.

FIG. 2 shows the construction of a bipolar transistor used in this invention, and in the bipolar transistor, an $N^+$-type buried layer 22 for lowering the collector resistance is formed in the surface area of a $P^-$-type silicon substrate 21. Further, a $P^+$-type epitaxial silicon layer 23 is formed in the surface area of a $P^-$-type silicon substrate 21. Phosphorus is doped into the $P^+$-type epitaxial silicon layer 23 to form an N-type well 24. A field oxide film 25 is formed on the surfaces of the silicon layer 23 and the N-type well 24, and a collector lead-out layer 26 reaching the $N^+$-type buried layer 22 is formed via one of the openings formed in the field oxide film 25. A $P^-$-type base region 27 is formed in the N-type well 24 via the other opening. An $N^+$-type emitter region 28 of 2 $\mu m \times 5$ $\mu m$ is formed in part of the $P^-$-type base region 27 and an emitter polycide 29 is formed on the emitter region 28. A $P^+$-type layer 30 is formed in self-alignment with the emitter polycide 29 in the $P^-$-type base region 27, and an $N^+$-type layer 31 is formed on the surface of the collector lead-out layer 26.

The semiconductor structure with the above construction is covered with a silicon oxide film 32, and collector, base and emitter electrodes 35, 36 and 37 formed of an Ti/TiN film 33 and Al-Si 34 disposed thereon are formed in contact holes formed in the silicon oxide film 32.

In the process of manufacturing the above semiconductor device, Sb is thermally diffused into the $P^-$-type silicon substrate 21 at 1250° C. for 25 minutes in an $Sb_2O_3$ atmosphere so as to form the $N^+$-type buried layer 22. Next, the resultant semiconductor structure is processed at 1150° C. for 10 minutes in an $SiH_2C_{12} + B_2H_6$ atmosphere so as to grow the $P^-$-type epitaxial silicon layer 23. After this, phosphorus is ion-implanted into the silicon layer 23 with an acceleration voltage of 160 KeV and a dose amount of $5 \times 10^{12}$ cm$^{-2}$ and subjected to a heat treatment at 1100° C. for 290 minutes in an $N_2$ atmosphere. As a result, phosphorus is diffused into the silicon layer 23 to form the N-type well 24.

Next, the field oxide film 25 is formed on the surface of the resultant semiconductor structure and then phosphorus ($P^+$) is ion-implanted into the N-type well 24 to form the $N^+$-type collector lead-out layer 26. After this, boron ($B^+$) is ion-implanted into the N-type well 24 with an acceleration voltage of 30 KeV and a dose amount of $5 \times 10^{13}$ cm$^{-2}$ form the $P^-$-type base region 27. Then, a thin silicon oxide film is formed on the surface of the resultant semiconductor structure, an opening is formed in the silicon oxide film and polysilicon is deposited to a thickness of 500 Å on the base region 27 via the opening. Arsenic ($As^+$) is ion-implanted into the polysilicon layer with an acceleration voltage of 60 KeV and a dose amount of $5 \times 10^{15}$ cm$^{-2}$, an MoSi film is deposited on the surface of the polysilicon layer and patterned to form the emitter polycide 29.

Boron ($B^+$) is ion-implanted into the base region 27 to form the $P^+$-type layer 30. Further, arsenic ($As^+$) is ion-implanted into the collector lead-out layer 26 to form the $N^+$-type layer 31. After this, the silicon oxide film 32 is formed on the surface of the resultant semiconductor structure obtained in the above step, contact holes are formed in the silicon oxide film 32, and the Ti/TiN film 33 is formed on the bottom portion of the contact holes. The Al-Si layer 34 is deposited on the surface of the resultant semiconductor structure thus obtained, and is then patterned to form the collector, base and emitter electrodes 35, 36 and 37.

Figure 3:
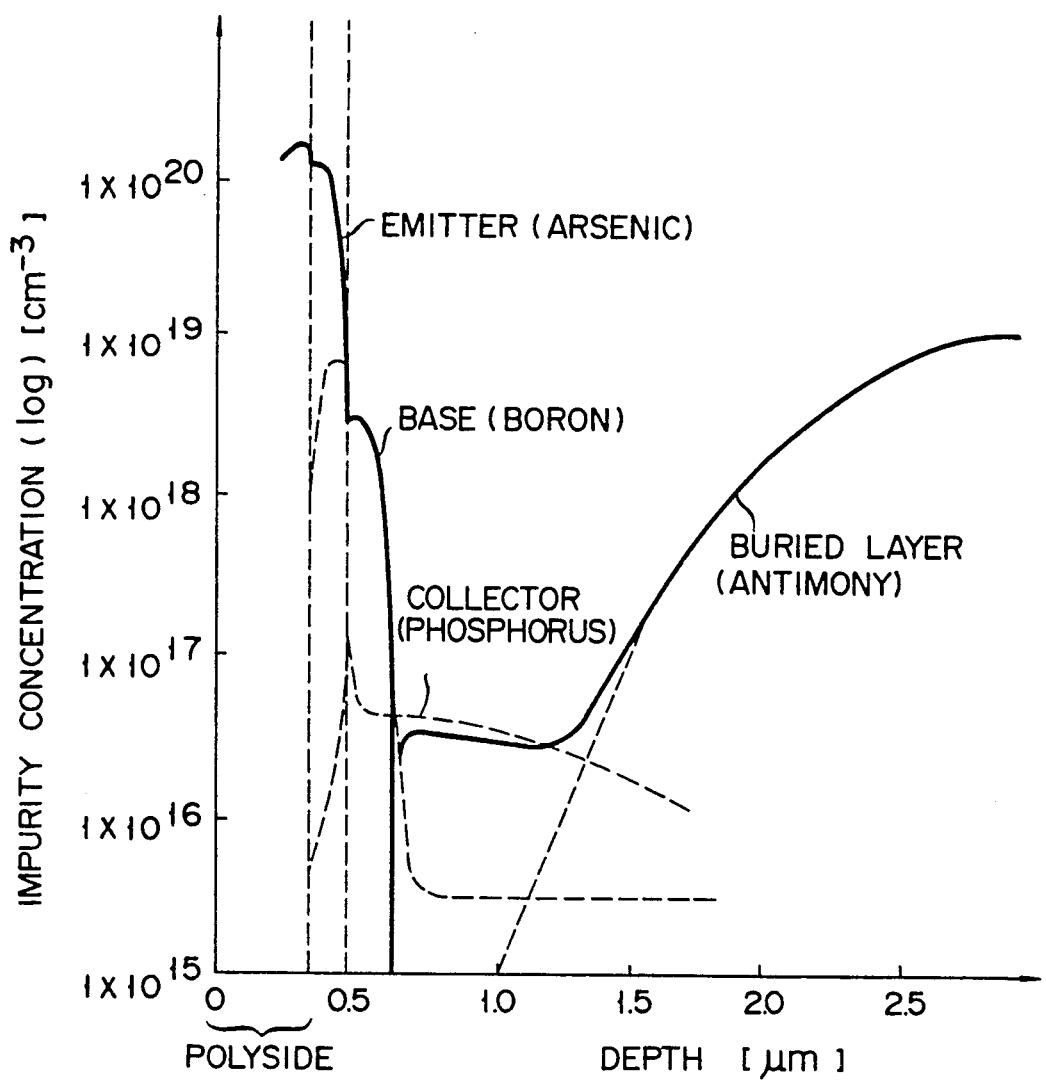
FIG. 3 is a graph showing an impurity profile of the bipolar transistor shown in FIG. 2.

The impurity profile of the NPN bipolar transistor of the semiconductor device thus constructed is shown in FIG. 3.

The emitter is formed with the impurity concentration of $1.5 \times 10^{20}$ cm$^{-3}$ and the junction depth of 0.15 $\mu m$ from the surface of the P-type epitaxial silicon layer 23, the base is formed with the impurity concentration of $3 \times 10^{18}$ cm$^{-3}$ and the junction depth of 0.3 $\mu m$, and the collector is formed with the impurity concentration of approx. $4 \times 10^{20}$ cm$^{-3}$ in the well region.

Figure 1:
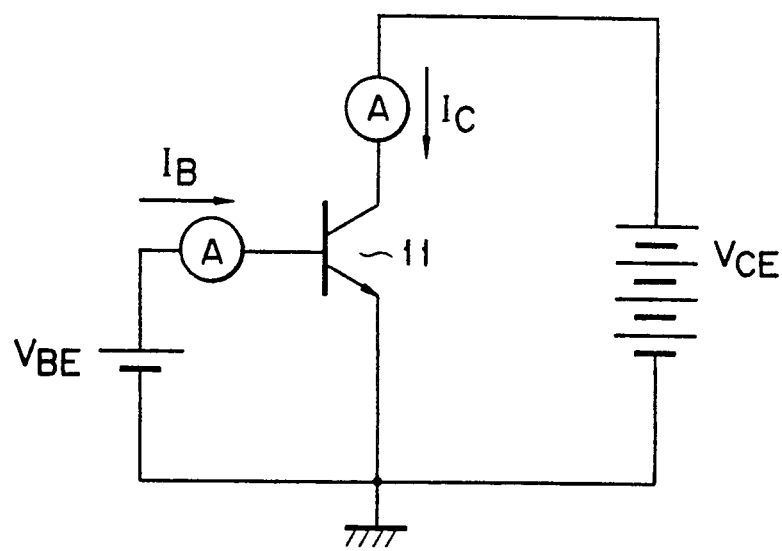
FIG. 1 is a circuit diagram of a semiconductor device using a bipolar transistor according to one embodiment of this invention.

An NPN bipolar transistor circuit shown in FIG. 1 can be obtained by using the semiconductor device formed in the above manufacturing condition. When the base-emitter voltage and collector-emitter voltage are respectively set to $V_{BE}$ and $V_{CE}$ in this circuit, the collector current $I_C$ and base current $I_B$ vary with respect to the base-emitter voltage $V_{BE}$ as shown in FIG. 4.

Figure 4:
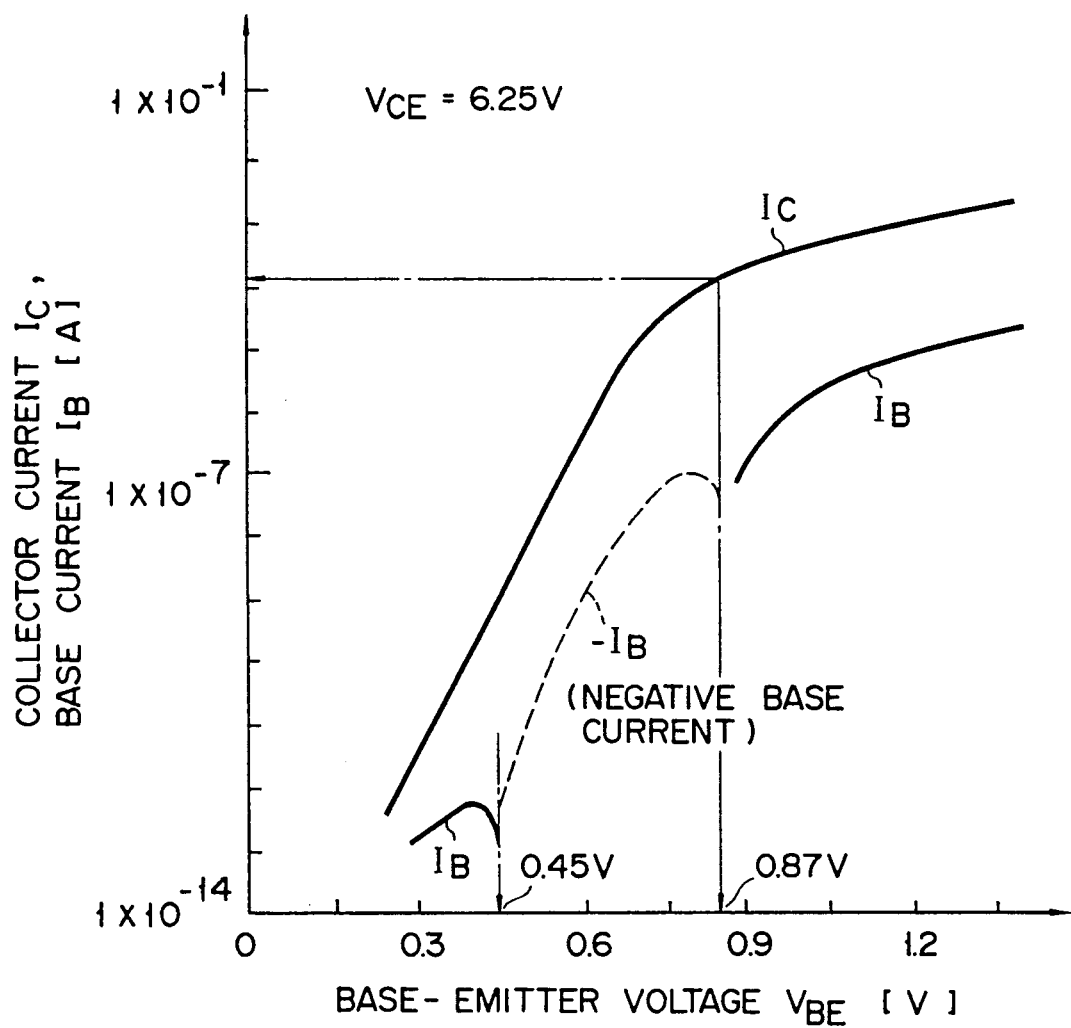
FIG. 4 is a graph showing the relation between the base-emitter voltage and the collector and base currents when $V_{CE} = 6.25$ V.

Referring to FIG. 4, the current characteristic obtained when the collector-emitter voltage $V_{CE}$ is set at 6.25 V is shown. A positive base current $I_B$ flowing from the positive terminal of the power source of base-emitter voltage $V_{BE}$ into the base exhibits the characteristic indicated by a solid line in a case where $0 \text{ V} < V_{BE} < 0.45$ V, a negative base current $-I_B$ flowing from the base into the positive terminal of the power source of base-emitter voltage $V_{BE}$ exhibits the characteristic indicated by broken lines in a case where $0.45 \text{ V} < V_{BE} < 0.87$ V, and a positive base current $I_B$ flowing from the positive terminal of the power source of base-emitter voltage $V_{BE}$ into the base again exhibits the characteristic indicated by a solid line in a case where $0.87 \text{ V} < V_{BE}$.

Figure 5:
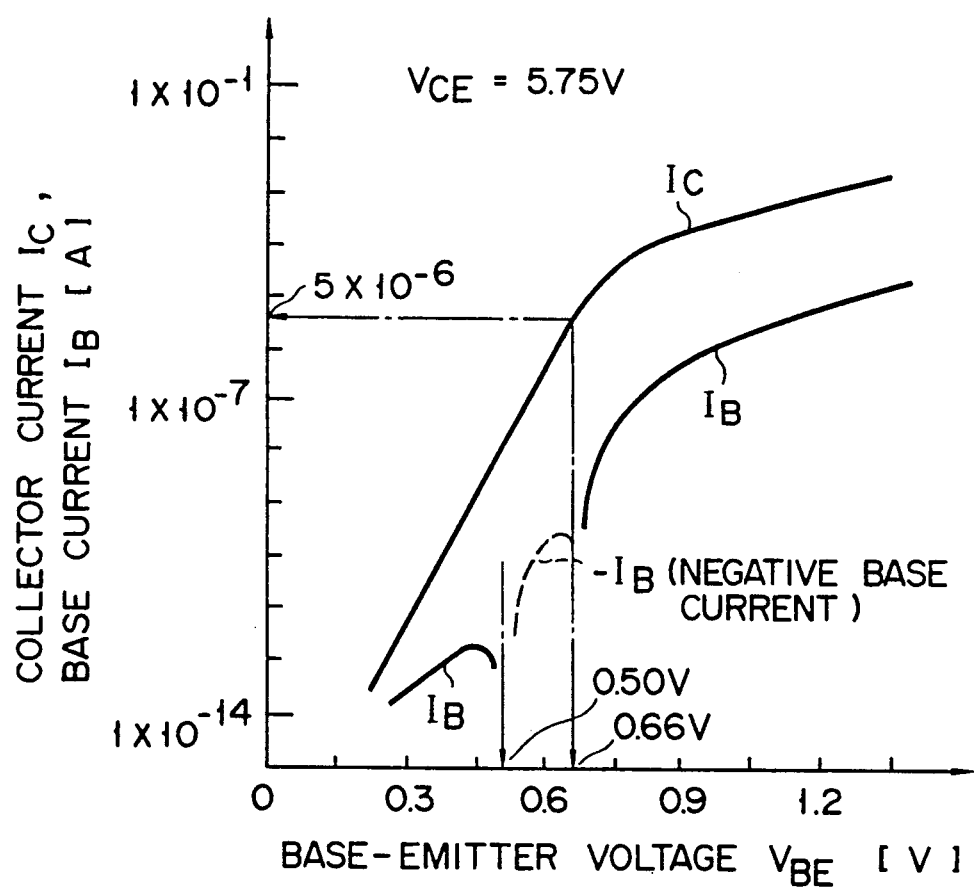
FIG. 5 is a graph showing the relation between the base-emitter voltage and the collector and base currents when $V_{CE} = 5.75$ V.

FIG. 5 shows the collector current and base current characteristics obtained when the collector-emitter voltage is set at 5.75 V. As is clearly seen from FIG. 5, the range of the base-emitter voltage $V_{BE}$ in which the base current $I_B$ is set to be negative is $0.50 \text{ V} < V_{BE} < 0.66$ V.

The condition in which the above negative base current is caused to flow is explained with reference to FIG. 6.

Figure 6:
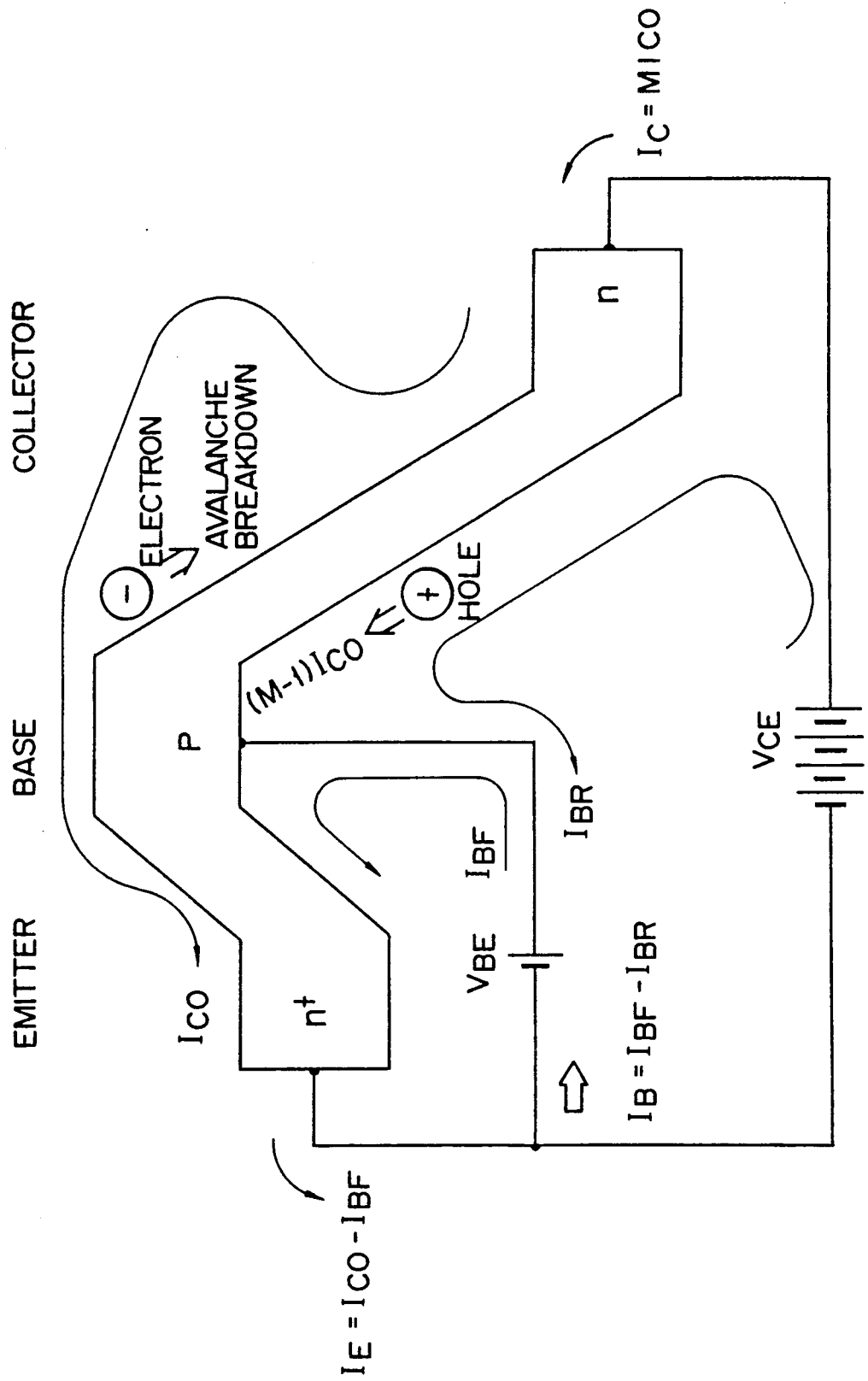
FIG. 6 is a diagram for explaining the operation principle of a semiconductor device.

The above negative current is caused according to the magnitude relation between a forward base current $I_{BE}$ (since it flows in a forward direction, it is denoted by $I_{BF}$ in FIG. 6) flowing from the base into the emitter and a reverse base current $I_{CB}$ (since it flows in a reverse direction, it is denoted by $I_{BR}$ in FIG. 6) caused in the collector-base path by carriers generated by impact ionization in the PN junction between the base and collector.

That is, when $|I_{BE}| > |I_{CB}|$, the base current becomes the positive base current $I_B$ as is observed in the ranges of $0 \text{ V} < V_{BE} < 0.45$ V and $V_{BE} > 0.87$ V, and when $|I_{BE}| < |I_{CB}|$, the base current becomes the negative base current $-I_B$ as is observed in the range of $0.45 \text{ V} < V_{BE} < 0.87$ V.

When electrons injected from the emitter are moved into the depletion layer of the base and collector junction, the electrons cause ionization to generate electron-hole pairs since the collector voltage is set at a high voltage level in an avalanche breakdown direction. The thus generated electrons and holes are respectively drifted to the collector and base by the effect of the electric field between the base and collector. The holes drifted to the base create the negative base current $I_{BR}$. The positive base current $I_{BF}$ from the base to the emitter is limited by a fixed base-emitter voltage $V_{BE}$. As a result, when $I_{BR}$ is larger than $I_{BF}$, a reverse base current is observed. On the other hand, in a case where the reverse current appears, the generated electrons only slightly contribute to the flow of the collector current since the electron current due to the generated electrons is smaller than the injected electron current from the emitter. This condition is explained by using equations.

In the model of Ebers-Moll, the collector current $I_{CO}$ and base current $I_{BF}$ in an normal transistor are expressed by the following equations (1) and (2):

$$I_{CO} = \alpha F I_{ES} \left\{ \exp\left(\frac{-qV_{BE}}{kt}\right) - 1 \right\} - I_{CS}\left\{ \exp\left(\frac{qV_{BC}}{kt}\right) - 1 \right\} \quad (1)$$

$$I_{BF} = (1 - \alpha F) I_{ES} \left\{ \exp\left(\frac{qV_{BC}}{kT}\right) - 1 \right\} + $$

$$(1 - \alpha F) I_{CS} \left\{ \exp\left(\frac{qV_{BC}}{kT}\right) - 1 \right\} \quad (2)$$

where $I_{ES}$ denotes a reverse saturation current in the emitter-base junction, $I_{CS}$ denotes a reverse saturation current in the collector-base junction, $\alpha F$ denotes the ratio of the current reaching the collector to the entire current flowing across the emitter-base junction, and $\alpha R$ denotes the ratio of the current reaching the emitter to the entire current flowing across the emitter-base junction. Further, k denotes the Boltzmann constant, T denotes the absolute temperature, and q denotes the charge amount. In a case where the collector-base voltage $V_{CE}$ is high and impact ionization in the base-collector PN junction cannot be neglected, the collector current $I_C$ is expressed by the following equation:

$$I_C = MI_{CO} \quad (3)$$

$$M = \frac{1}{1 - (V_{CB}/BV_{CBO})^n} \quad (4)$$

In this case, $I_{CO}$ denotes the collector current in a case where the impact ionization is neglected, n denotes a constant, and $BV_{CBO}$ denotes a withstanding voltage between the base and collector when the emitter is open-circuited.

As shown in FIG. 6, holes generated by impact ionization are moved into the base by the effect of an electric field so as to produce a reverse base current $I_{BR}$.

As a result, $I_{BR}$ can be obtained by the following equation:

$$I_{BR} = (M-1)I_{CO} \quad (5)$$

That is, the base current $I_{BF}$ can be expressed by a difference between the forward base current $I_{BF}$ and the reverse base current $I_{BR}$ as shown in the following equation:

$$I_B = I_{BF} - I_{BR} = I_{BF} - (M-1)I_{CO} = \{1 - (M-1) h_{FE}\}I_{BF} \quad (6)$$

The emitter current $I_E$ can be expressed by $I_E = I_{CO} + I_{BE}$. In this case, hFE denotes a current gain ($h_{FE} = I_{CO}/I_{BF}$).

The operation can be applied not only to the NPN bipolar transistor but also to a PNP bipolar transistor.

When a capacitive load is connected between the base and emitter as described in the case of explaining the operation of the bipolar transistor circuit shown in FIG. 1 with reference to FIGS. 4 and 5, charges stored on the load flow out from the base to the emitter in a case where the base voltage $V_{BE}$ is set in the range of $0 \text{ V} < V_{BE} < 0.45$ V so that the voltage $V_{BE}$ across the load can be lowered and will approach 0 V. On the other hand, charges are stored on the load by the reverse base current when the base voltage $V_{BE}$ is set in the range of $0.45 \text{ V} < V_{BE} < 0.87$ V so that the voltage $V_{BE}$ across the load can be raised and will approach 0.87 V. Further, since a positive base current flows out from the base to the emitter when the base voltage $V_{BE}$ is set in the range of $0.87 \text{ V} < V_{BE}$, the voltage $V_{BE}$ across the load can be lowered and will also approach 0.87 V. As described above, $V_{BE}$ may be held at 0 V or 0.87 V and thus a voltage with self-amplification function can be held.

Figures 7, 9:
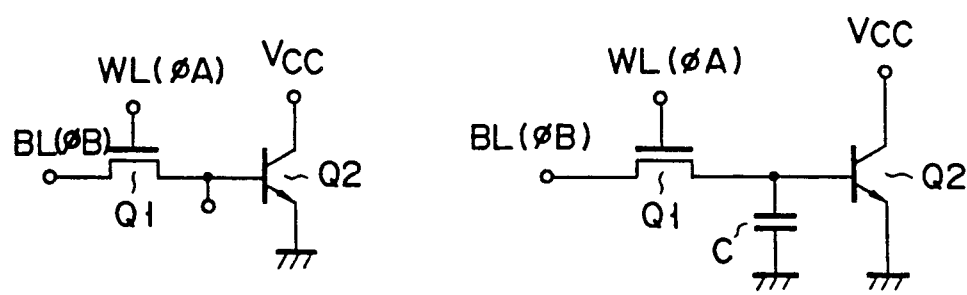
FIG. 7 is a diagram of a memory cell.
FIG. 9 is a circuit diagram of another memory cell.

FIG. 7 shows a voltage holding circuit having the above voltage holding function.

In the above circuit of FIG. 7, an n-channel MOS transistor Q1 is used as a switching element, and the drain or source of the transistor is connected to the base of an NPN bipolar transistor Q2. The gate of the MOS transistor Q1 is supplied with a clock $\phi A$ and the source or drain thereof is supplied with a clock $\phi B$. In this circuit, the capacitive load is formed of a junction capacitor between the base and emitter and a junction capacitor between the collector and base.

Figure 8:
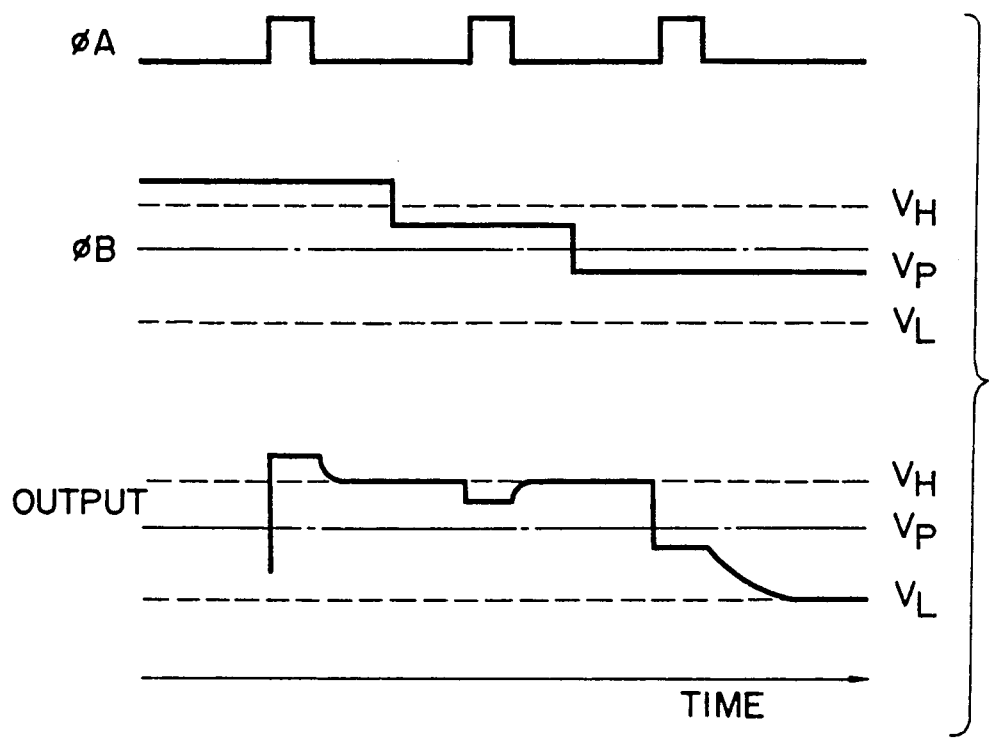
FIG. 8 is an operation timing chart of the memory cell shown in FIG. 7.

FIG. 8 shows the control clock $\phi A$ and input clock $\phi B$ of the MOS transistor Q1 and the voltage level of an output terminal provided at a node between the MOS transistor Q1 and bipolar transistor Q2. In this case, $V_H$, $V_p$ and $V_L$ respectively indicate 0.87 V, 0.45 V and 0 V.

In the circuit of FIG. 7, when the clock $\phi A$ is set to a high level, the MOS transistor Q1 is turned on. At this time, $\phi B > V_H$ (0.87 V) is supplied to the base of the bipolar transistor Q2, thereby charging the capacitive load to a voltage level higher than $V_H$. After this, when the clock $\phi A$ is set to a low level to turn off the MOS transistor Q1, the voltage higher than $V_H$ charged on the capacitive load and applied to the base is discharged via the base-emitter path of the transistor Q2, that is, a positive base current flows into the base, thereby holding the base voltage at 0.87 V. Next, when the clock $\phi B$ in the range of 0.45 V $< \phi B <$ 0.87 V is applied to the base, a negative base current flows into the capacitive load via the collector-base path of the transistor Q2 so that an output voltage or the base voltage can be raised and set to 0.87 V. When $\phi A$ ($<$0.45 V) is applied to the base of the transistor Q2 via the MOS transistor Q1, a positive base current flows out via the base-emitter path to set the base voltage to 0 V. That is, in the case of $\phi A > 0.45$ V, the boundary potential of 0.87 V is held, and in the case of $\phi A < 0.45$ V, 0 V is held.

In the circuit of FIG. 7, the connection node between the MOS transistor Q1 and bipolar transistor Q2 is used as the output terminal. However, the input terminal of the clock $\phi B$ can be used as the output terminal by setting the MOS transistor Q1 into the conductive state after the voltage holding operation.

FIG. 9 shows a circuit having a capacitive element C such as a MOS capacitor connected to the circuit of FIG. 7 in addition to the bipolar transistor Q2. In the circuit of FIG. 9, the charging and discharging operation via the base is positively effected by means of the capacitive element C. In this case, the input terminal of the clock $\phi B$ is used as the output terminal, but the output terminal can be provided at the connection node between the base of the transistor Q2 and the transistor Q1.

The memory is constructed by a bipolar transistor having the above-described voltage holding function. In this case, the collector voltage applied to the bipolar transistor can be changed in the voltage holding mode or data holding mode and in the charging and discharging mode or write-in or readout mode. The voltage changing operation is described below.

In the circuit of FIG. 1, the low and high levels of the base-emitter voltage $V_{BE}$ are respectively set at 0 V and 0.87 V when the voltage $V_{CE} = 6.25$ V as shown in FIG. 4. When the collector-emitter voltage $V_{CE}$ is set at 0.25 V and the voltage $V_{BE}$ is held at the high level, a collector current Ic of $1.5 \times 10^{-4}$ A always flows into the memory cell. However, as shown in FIG. 5, when the voltage $V_{CE} = 5.75$ V, the high level thereof is set at 0.66 V and the collector current Ic is set to $5 \times 10^{-6}$ A. That is, when the voltage $V_{CE} = 5.75$ V, the collector current Ic is reduced to 1/30 of that set in the case of $V_{CE} = 6.25$ V. In other words, the power consumption of the memory cell can be reduced. However, if data is read out in the case of $V_{CE} = 5.75$ V, the high voltage level in the memory cell may be frequently set to be lower than 0.50 V by noise caused at the rising and falling times of the word line voltage and by the operation of charging the capacitor of the bit line, thus increasing the possibility that the base-emitter voltage $V_{BE}$ may be lowered to 0 V by the forward base current. That is, only the noise margin of 0.66 V $-$0.50 V $=$ 0.16 V can be obtained. However, if data is read out in the case of $V_{CE} = 6.25$ V, the noise margin becomes as large as 0.87 V $-$0.45 V $=$ 0.42 V so that the possibility that the high voltage level is lowered to a low level in the data readout mode can be reduced. Therefore, when cell data is read out, the erroneous operation of the memory cell can be prevented by setting the collector potential higher in the readout mode than in the data holding mode.

In the memory cell of FIG. 10, the source or drain of the MOS transistor Q1 used as the switching element is connected to the base of the bipolar transistor Q2. In this example, a p-channel (or n-channel) MOS transistor is used as the transistor Q1 and an NPN transistor is used as the transistor Q2. The collector-emitter voltage of the transistor is set so that the polarity of the base current can be changed as the base-emitter voltage is increased.

The gate of the MOS transistor Q1 is connected to a word line WLn and the drain or source thereof is connected to a bit line BLn. The connection node between the transistors Q1 and Q2 is a storing node S of the memory cell, a storage capacitance $C_S = C_{BE} + C_{BC}$ (where $C_{BE}$ is a junction capacitance between the base and emitter of the transistor Q2 and $C_{BC}$ is a junction capacitance between the base and collector) is present. In addition to the capacitor $C_S$, a capacitive element C1 such as a MOS capacitor can be provided. When the capacitor element C1 is provided, the other end thereof is set at an adequate plate potential or substrate or well potential.

FIG. 11 shows the operational characteristic of the bipolar transistor representing the data storage state on the storage node S in FIG. 10 or the relation between the base-emitter voltage and the base current. The boundary potential $V_{BE1}$ on the high-level side of the positive and negative base currents indicates a "1" storing state and $V_{BE0}$ indicates a "0" storing state.

Figure 12A:
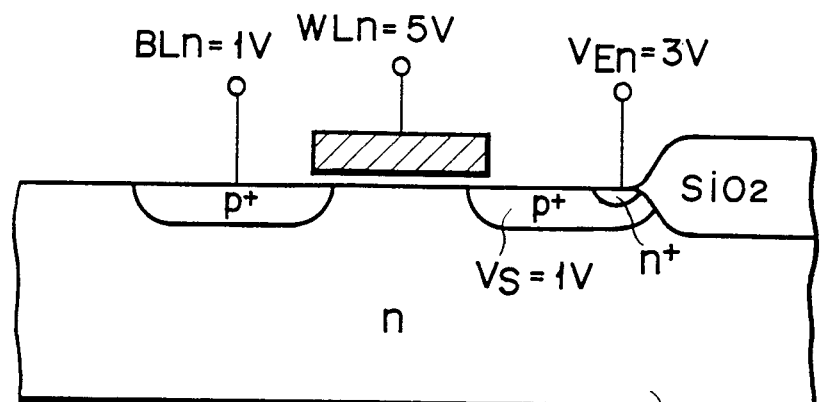
FIGS. 12A to 12D are memory cell diagrams for explaining the operation of the memory cell shown in FIG. 10.
Figure 12B:
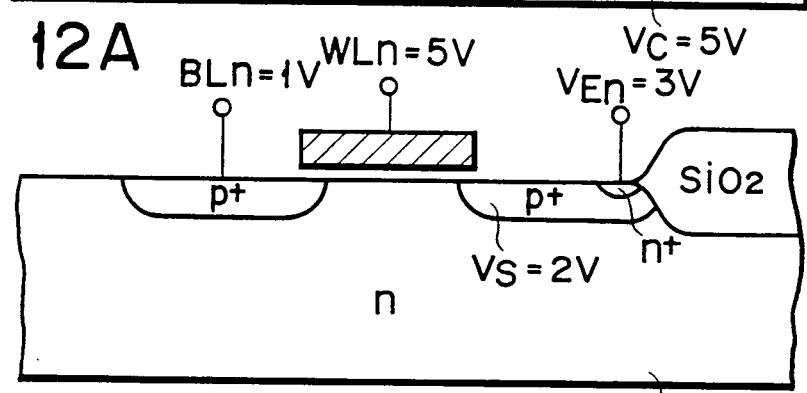

FIGS. 12A to 12D show the operating states of the memory cell of FIG. 10. In the memory cell, a PMOS is used as a transfer gate and an NPN transistor is used as the bipolar transistor. FIGS. 12A and 12B indicate the states in which data "0" and "1" are stored on the storage node S of the memory cell, and the potential $V_S$ at the storage node S is set at 1 V and 2 V in the respective states. In this case, since the base-collector junction and base-emitter junction of the bipolar transistor are biased in a reverse direction, the base (storage node S) of the bipolar transistor is set into the electrically floating condition. Therefore, charges stored on the storage node S (or charges stored on the base-collector junction capacitor and the base-emitter junction capacitor) are held according to a holding characteristic in the same manner as in a DRAM. However, the refresh operation of the memory cell is different from that of the DRAM in that a positive or negative base current is caused according to the base potential of the data storage node or the level of the base-emitter voltage by changing the emitter potential to set the PN junction between the base and emitter of the bipolar transistor of the memory cell into the forward bias condition in the refreshing operation and thus the memory cell data can be refreshed by the positive or negative base current. The function is the same as the self-amplification function of an SRAM cell constituted by a flip-flop, and each memory cell constituted by one MOS transistor and one bipolar transistor has the same amplification function as a sense amplifier of the DRAM. Since each memory cell has the self-amplification function as described above, it becomes unnecessary to set the refresh cycle separately from the access cycle unlike the DRAM, and the refresh operation can be effected independently from the access cycle. Therefore, unlike the DRAM, dead time caused by the refresh cycle which cannot be accessed by the CPU is not present in a semiconductor memory device using the memory cell with the above-described construction. Thus, the semiconductor memory device itself needs the refresh operation, but the user can use the semiconductor memory device in the same manner as an SRAM. The duty ratio (ratio of the refresh period to the refresh period + floating period) for the refresh operation of the memory cell may be determined according to the data holding characteristic of the memory cell. For example, in a case where a through current flowing in the collector-emitter path when data "1" is held in the memory cell is 2.5 $\mu$A/cell, the average through current will be 2.5 A if the emitter potential is not clocked in a 1-Mbit semiconductor memory device constructed by using the above memory cells. However, when the emitter is clocked as in this invention and if the duty ratio is set at 1/100, the average through current may be significantly reduced to 25 mA.

Figure 12C:
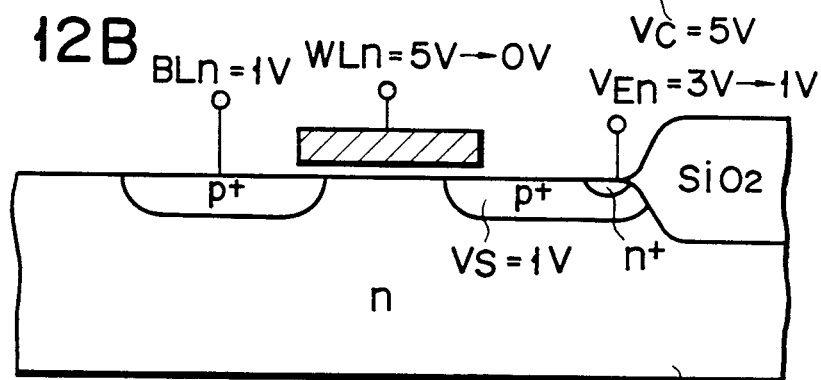
Figure 12D:
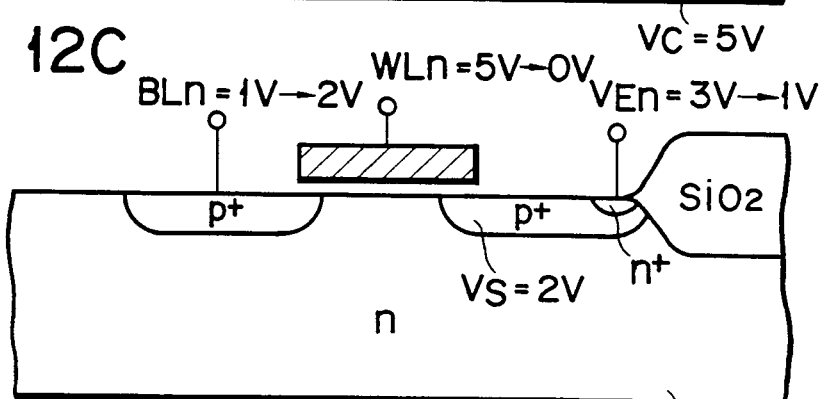
Figure 13A:
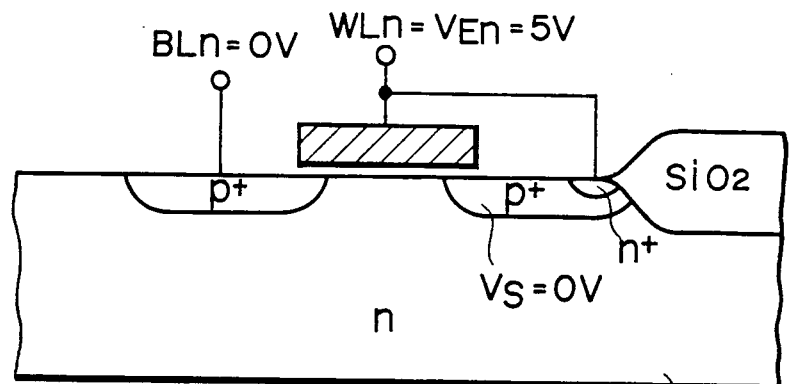
FIGS. 13A to 13D are diagrams for explaining the operation of a memory cell according to another embodiment of this invention and connected to a word line and an emitter electrode selection line.
Figure 13B:
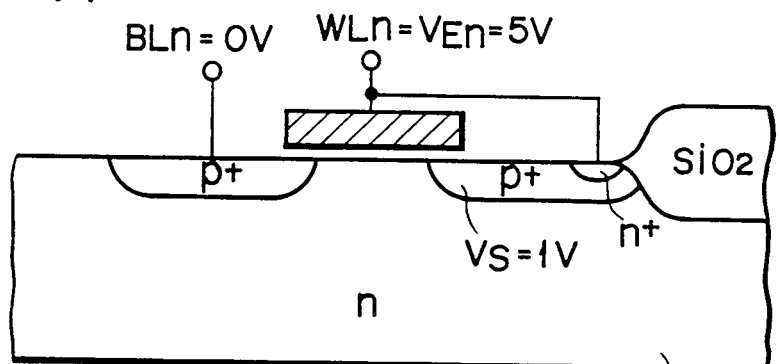
Figure 13C:
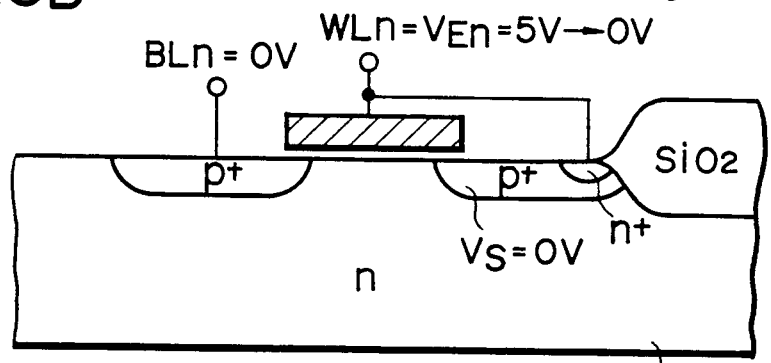
Figure 13D:
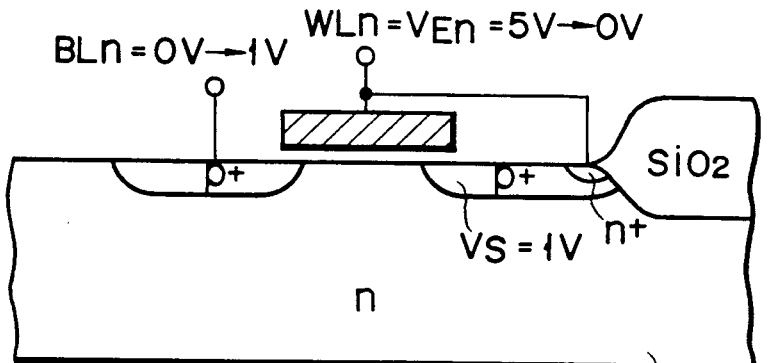

The readout condition of the memory cell is shown in FIGS. 12C and 12D. When the potential of a word line WLn is changed from 5 V to 0 V to select the word line, the emitter potential $V_{En}$ of a cell selected by the selected word line is changed from 3 V to 1 V. As a result, the base-emitter junction of the bipolar transistor is biased in the forward direction to set the bipolar transistor active. When the collector-emitter voltage $V_{CE}$ is set to be equal to a voltage which causes the reverse base current characteristic, for example, to a voltage as high as 4 V (5 V − 1 V), the base current $I_B$ shown in FIG. 11 flows according to the base-emitter voltage.

That is, as shown in FIG. 12C, when Vs = 1 V and VEn = 1 V, that is, when the base-emitter voltage is 0 V ($V_{BE0}$), the base current is set to substantially 0 and no fluctuation occurs in the potential of the bit line BLn. On the other hand, as shown in FIG. 12D, when Vs = 2 V and $V_{En}$ = 1 V, that is, when the base-emitter voltage is 1 V ($V_{BE1}$), a reverse base current flows from the base to the collector of the bipolar transistor since the bit line potential BLn is as low as 1 V with respect to the potential Vs = 2 V of the storage node S in the initial period of the readout operation, and the reverse base current flows into the bit line BLn via the transfer gate, thereby raising the bit line potential and setting the same to 2 V which is equal to Vs.

In the write-in operation, BLn is set to 1 V or 2 V for writing data "0" or "1", respectively, the potential of the word line WLn is set to 0 V, and the emitter voltage $V_{En}$ is set to 1 V. When the readout or write-in operation is completed, the word line potential and the emitter voltage are again set to the initial levels, that is, WLn = 5 V and $V_{En}$ = 3 V are set. In this way, in the memory cell of this invention, the capacitor connected to the storage node is set into the electrically floating condition in the data storing state so as to store data in the same manner as in the DRAM. On the other hand, in the readout operation, the bipolar transistor is activated, and particularly, it is operated as a gain cell in the data "1" readout operation. In order to set the electrically floating condition, the base and the emitter may be isolated from each other and the emitter may be cut off in an extreme case.

This invention can also be effectively applied even when the emitter potential ($V_{En}$) is kept constant in the write-in operation and is changed only in the readout operation. Further, it is not necessary to change the emitter potential at the same time as the word line potential is changed, and this invention can be effectively applied when the emitter potential is changed before or after the word line potential is changed.

An electrostatic capacitor may be used in addition to the base-collector junction capacitor and the base-emitter junction capacitor as the capacitor of the storage node S. This invention can also be effectively applied when a trenched capacitor or stacked capacitor which is used in the present DRAM is used as the electrostatic capacitor. The capacitance of the capacitor to be added may be determined according to the soft error rate.

According to the memory cell shown in FIGS. 13A to 13D, the word line WLn and emitter are connected together and are applied with the same voltage. That is, WLn = $V_{En}$ = 5 V. In the state shown in FIG. 13A, Vs = 0 V and $V_{En}$ = 5 V, and data "0" is stored in this state. In the state shown in FIG. 13B, Vs = 1 V and $V_{En}$ = 5 V, and data "1" is stored in this state. In the data readout operation, the potential of the word line WLn and the emitter voltage $V_{En}$ are set to 0 V. At this time, a voltage which causes the reverse current characteristic or a voltage of 5 V (Vc − $V_{En}$: 5 V − 0 V) is applied between the base and the emitter, and a base current flows according to the base-emitter voltage as shown in FIG. 11. In the case shown in FIG. 13C, since the base-emitter voltage is 0 V, the base current is substantially equal to 0 and the potential of the bit line BLn will not vary. That is, data "0" is read out. In contrast, in the case of FIG. 13D, since the base-emitter voltage is 1 V and the potential of the bit line BLn is as low as 1 V with respect to the potential Vs of the storage node S, a reverse base current flows from the collector to the base of the bipolar transistor and then flows into the bit line BLn via the transfer gate, thereby raising the bit line potential and setting the same to 1 V which is equal to Vs. At this time, data "1" is read out.

In the above embodiment, the threshold voltage of the transfer gate can be designed to be higher than 0 V.

Figure 14A:
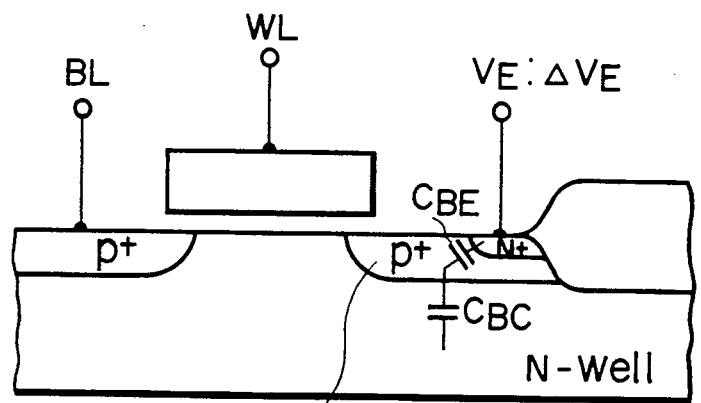
FIGS. 14A to 14C are views showing the cross sections of a memory cell for explaining the capacitive coupling of the data storing node and showing the potential at each portion of the memory cell.
Figure 14B:
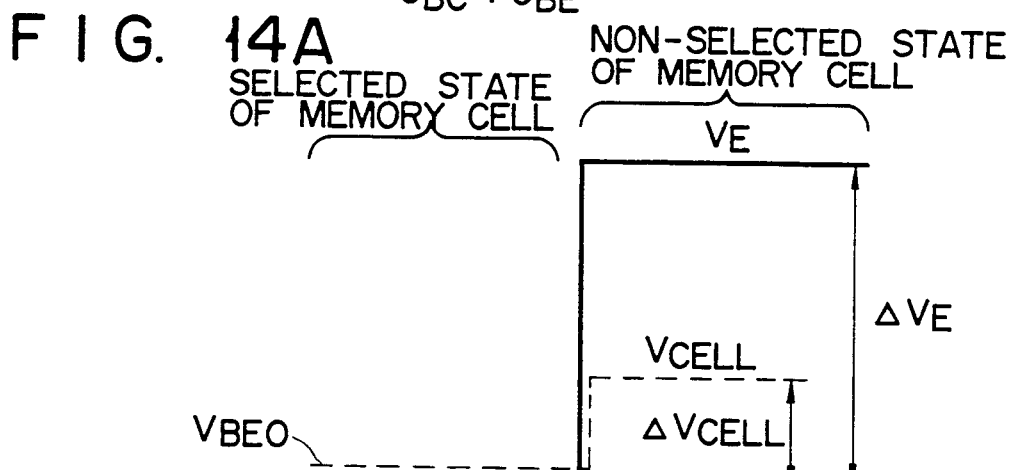
Figure 14C:
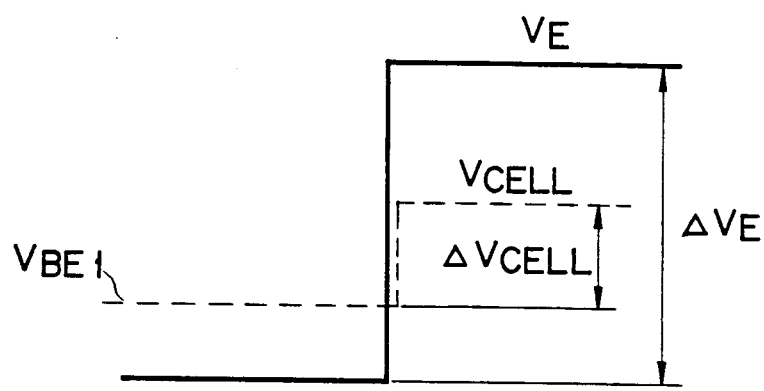

FIGS. 14A to 14C are diagrams showing the potential $V_{CELL}$ of the storage node S. Assuming that the potential amplitude of the emitter electrode line in the memory cell selection mode/non-selection mode is $\Delta V_E$, the potential of the storage node S is deflected by $\Delta V_{CELL}$ by capacitive coupling. The amplitude of the potential deflection can be determined based on the base-emitter junction capacitance $C_{BE}$, base-collector junction capacitance $C_{BC}$ (other capacitances are neglected) and $\Delta V_E$ as follows:

$$\Delta V_{CELL} = \frac{C_{BE}}{C_{BC} + C_{BE}} \Delta V_E$$

Therefore, the base-emitter path is biased in the reverse direction at the time of non-selection of the memory cell, and the condition in which the storage node S is set into the electrically floating state can be expressed as follows:

$$\Delta V_E > \Delta V_{CELL} + V_{BE1}$$

As a result, the following expression can be obtained:

$$\Delta V_E > \frac{C_{BC} + C_{BE}}{C_{BC}} \cdot V_{BE1}$$

FIG. 15 shows the layout of the memory cell array and a peripheral circuit thereof. In FIG. 15, a reference symbol M/C denotes the memory cell shown in FIG. 1, and $N \times N = N^2$ memory cells are arranged. In this example, the memory area is divided into a plurality of blocks each having N memory cells in a row direction and M memory cells in a column direction. Bit lines BL1 to BLM, - - -, BL(N−M+1) to BLN are respectively connected to sub-I/O lines (pre I/O 1 to pre I/O N/M) which are each provided for each block via transfer gates such as n-channel MOS transistors T1 whose conduction states are controlled by respective column selection signals CSL1 to CSLM, - - -, CSL(N−M+1) to CSLN. Further, sub-I/O sense amplifiers (pre I/O S/A) are each provided for each block.

In this embodiment, a dummy cell D/C which is connected to a corresponding one of bit lines $\overline{BLM'}$ to $\overline{BLN'}$ and is controlled by a dummy word line DWL is provided in each block, and is connected to a corresponding one of sub-$\overline{I/O}$ lines (pre $\overline{I/O}$ 1, - - -, pre $\overline{I/O}$ N/M) which are arranged in parallel with the respective sub-I/O lines in the same manner as the memory cells M/C are connected.

Emitter electrode selection lines are arranged in parallel with the respective word lines, and the word lines and emitter electrode selection lines are connected to a decoder.

The sub-I/O sense amplifier in each block is connected to the sub-I/O and $\overline{I/O}$ lines, and the amplified potentials of the sub-I/O and $\overline{I/O}$ lines are transmitted to corresponding input/output lines I/O and $\overline{I/O}$ via transfer gates such as n-channel MOS transistors T2 whose conduction states are controlled by column selection signals CSL M'D, - - -, CSL N'D.

The I/O and $\overline{I/O}$ lines are connected to a data input (DIN) buffer circuit and a main-I/O sense amplifier (I/O S/A). An output of the main-I/O sense amplifier is output from a Dout pin via a data output (Dout) buffer circuit.

The above semiconductor memory has active and precharge states which are selectively set by a row address strobe RAS (or chip select $\overline{CS}$).

Next, a case wherein the chip operation is basically determined by a 1-pin control signal is explained. In this case, the address multiplex system in which the row and column addresses are received in a time sharing fashion by RAS and CAS in the same manner as in the conventional DRAM.

Figure 16:
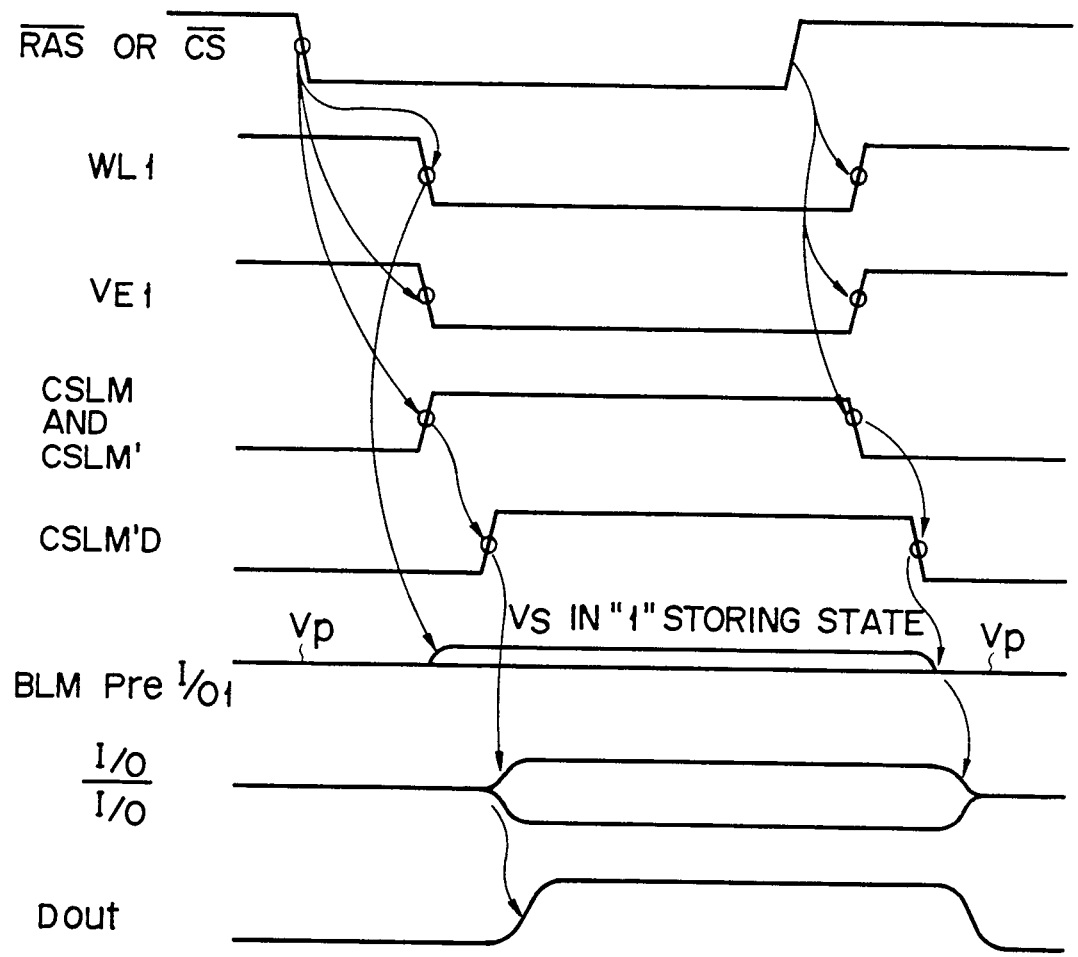

First, referring to FIG. 16, the readout operation is explained. In the precharge state in which $\overline{RAS}$ is set at a "H" level, the MOS transistor Q1 of the memory cell M/C is turned off by setting the word line WLn (n=1, - - -, N) to the "H" level. The bit lines BL1 to BLM, - - -, BL(N−M+1) to BLN, $\overline{BLM'}$ to $\overline{BLN'}$ and the sub-I/O and $\overline{I/O}$ lines (pre I/O 1 to pre I/O N/M, pre $\overline{I/O}$ 1 to pre $\overline{I/O}$ N/M) are precharged to the VP potential. In this case, the VP potential is set to a potential lower than a potential of the node S set when the "H" level is stored in the memory cell shown in FIG. 10. In this embodiment, the VP potential is set to a low potential of the node S set when "L" is stored.

Next, when $\overline{RAS}$ is set to the "L" level and an address is received, for example, in a case where a memory cell A shown in FIG. 15 is selected, the word line WL1 and column selection line CSLM are activated. At the same time, the emitter electrode selection line VE1 is also activated. In a case where data "1" is stored in the memory cell, the potential of the bit line BLM is raised from the potential Vp to the potential Vs of the storage node S.

A difference between the potentials Vs and Vp, that is, a potential difference $\Delta V(=Vs-Vp)$ is amplified by the sub-I/O sense amplifier. A dynamic type sense amplifier or differential amplifier can be used as the sub-I/O sense amplifier (pre I/O S/A). Further, it is possible to use an unbalanced type sense amplifier capable of sensing only data "1". In this case, the dummy cell is not necessary. The timing chart of FIG. 15 shows a case wherein dummy cells are not used and the pre I/O sense amplifier is constructed by an unbalanced type sense amplifier.

Next, CSLM'D is raised, data is transferred to the I/O and $\overline{I/O}$ lines, the main sense amplifier (I/O S/A) connected to the I/O and $\overline{I/O}$ lines is activated, and data is output from the Dout buffer. That is, data is read out.

FIG. 17 shows a timing chart of the data write-in operation. In the data write-in operation, $\overline{RAS}$ and $\overline{WE}$ are set to the "L" level so as to cause a preset potential to be transmitted from the DIN buffer via the I/O line, pre I/O line and bit line BLM and written into a memory cell (for example, the memory cell A in FIG. 15) selected by means of the word line. In this case, the current supplying capacity of the DIN buffer is set to be larger than the base current $I_B$ which is permitted to flow in the NPN transistor of the memory cell, and "$V_{BE1}+V_{CELL}$" or "$V_{BE0}+\Delta V_{CELL}$" is forcedly written into the storage node S in the case of writing data "1" or "0", respectively. In the write-in operation shown in FIG. 17, the potential ($V_{E1}$) of the emitter electrode selection line is kept constant.

FIG. 18 shows a timing chart of the memory cell refresh operation. In the refresh operation, a refresh control signal REF which is independent from a chip select signal may be supplied from the exterior of the chip. When the control signal REF is set to the "L" level and an address is input, only the emitter electrode line is selected with the word line kept in the non-selected state so as to change the potential of the emitter electrode line from the "H" to the "L" level. The address may be an external address signal (ext. Add) input from the exterior of the chip, or an internal address signal (int. Add) exclusively used for the refresh operation and output from an address counter in the chip can be used. In this case, a shift register may be further provided in the emitter electrode line decoder in addition to the address counter so as to generate continuous addresses at a high speed.

A $\overline{CAS}$-before-$\overline{RAS}$ mode (a mode which is exclusively used for the refresh operation and in which $\overline{CAS}$ is changed from "H" to "L" before $\overline{RAS}$) used in the conventional DRAM can be used instead of the control signal REF supplied from the exterior of the chip. Further, it is possible to provide an auto-refresh timer circuit in the chip and automatically start the refresh operation when a preset period of time has passed.

Figure 19:
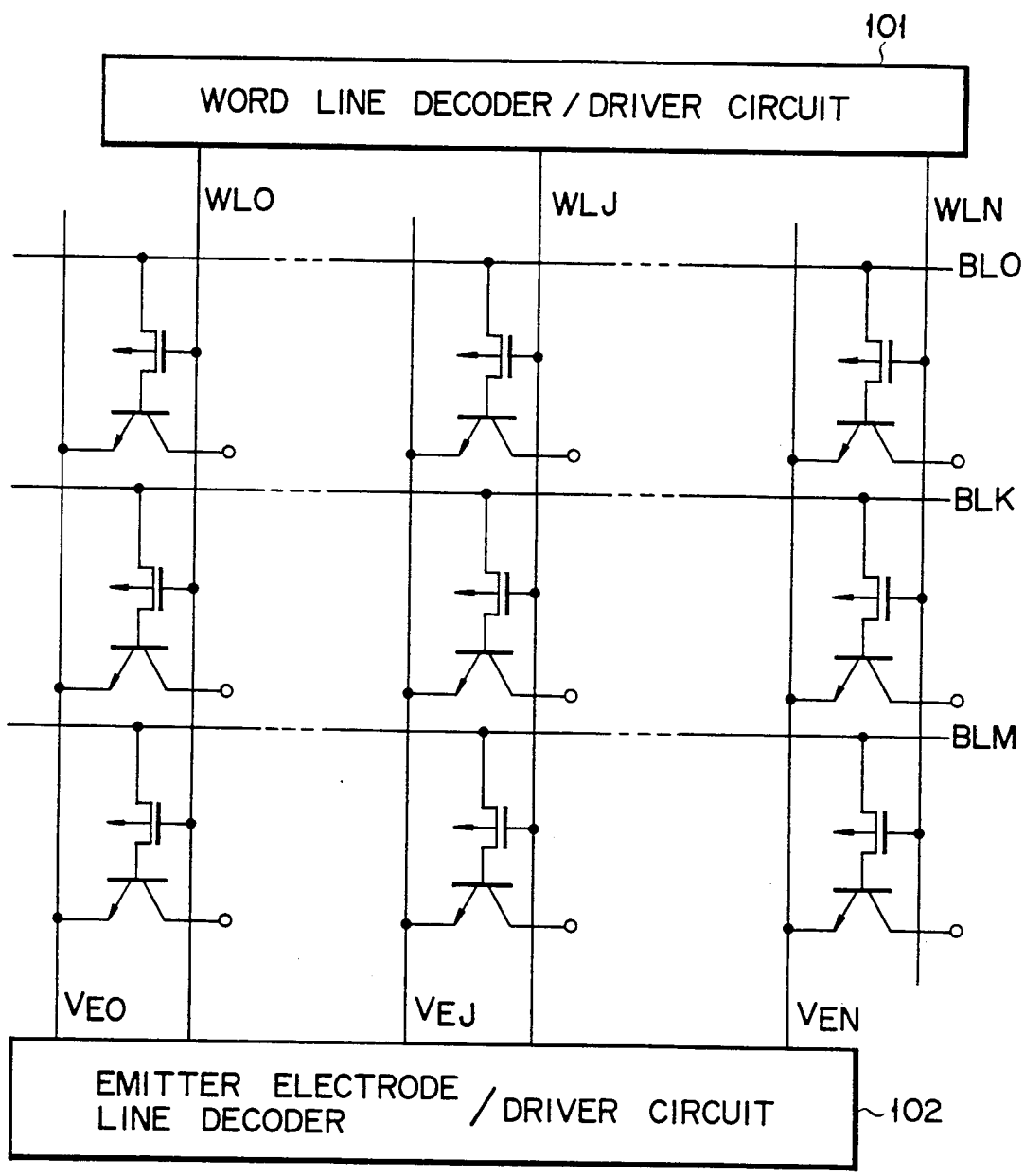
FIG. 19 is a circuit diagram of a memory device in which a word line decoder/driver circuit and an emitter electrode line decoder/driver circuit are separated from each other.

FIG. 19 shows a memory device in which the decoder is divided into an emitter electrode line decoder/driver circuit and a word line decoder/driver circuit. With this memory device, in the refresh operation, a plurality of emitter electrode lines VE0 to VEN which intersect the bit lines BL0 to BLM can be simultaneously selected. The simultaneous refresh operation is called flash refresh.

Further, since the decoder is divided into the emitter electrode line decoder/driver circuit and the word line decoder/driver circuit, the emitter electrode line can be selected before the word line in the readout operation. In this case, a plurality of word lines and one emitter electrode line commonly occupy the upper digit address.

FIG. 20 shows a memory device in which the decoder is divided into an emitter electrode line decoder/driver circuit and a word line decoder/driver circuit and a shift register circuit is provided in the emitter electrode line decoder/driver circuit. When the refresh operation is started in this memory device, continuous addresses are output from the shift register circuit to the emitter electrode line decoder/driver circuit at a high speed. In this way, an emitter electrode line is selected at a high speed by means of the emitter electrode line decoder/driver circuit with the word line kept in the non-selected state so as to effect the refresh operation of the memory cell.

Next, the refresh operation of a semiconductor memory device according to another embodiment is explained.

Unlike the refresh operation of the DRAM, the refresh operation in this embodiment can be effected with the word line kept in the non-selected state by use of the self-amplification function which each of the memory cells has. That is, in the refresh operation, the emitter potential is changed to bias the base-emitter PN junction of the bipolar transistor of the memory cell in the forward direction so as to charge or discharge the base which is the data storage node according to a positive or negative current caused by variation in the emitter potential, thereby setting the base potential back to the potential level set in the data write-in operation.

Further, unlike the DRAM, it is not necessary to provide dead time (inhibition time) in which the operation of writing data into the semiconductor memory device for the refresh operation and the operation of reading out data from the semiconductor memory device cannot be effected. That is, the refresh operation can be effected independently from the normal write-in and readout operations. As a result, the user can use the semiconductor memory device in the same manner as an SRAM in which dead time for the refresh operation is not necessary.

Figure 21:
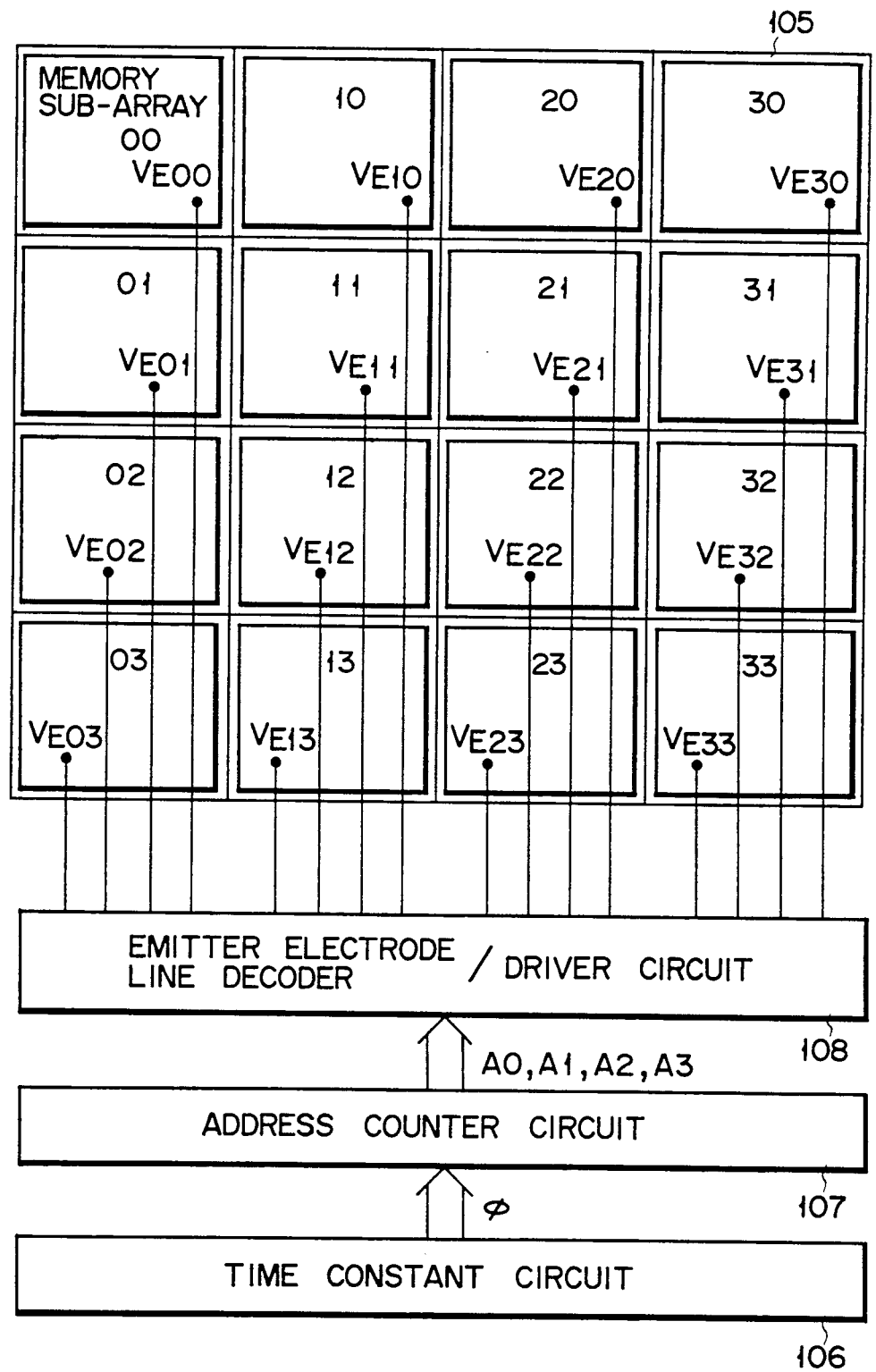
FIG. 21 is a circuit diagram of a memory cell array divided into a plurality of memory sub-arrays.
Figures 22A, 22B:
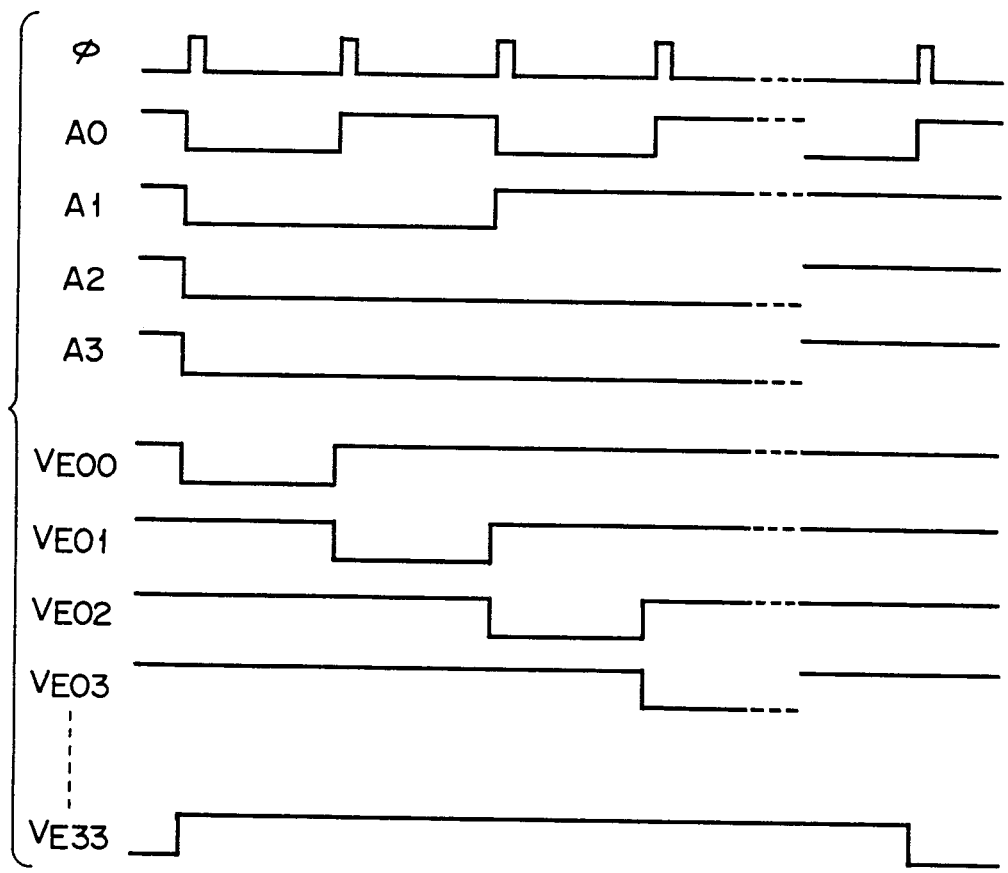
FIGS. 22A and 22B are a timing chart showing the timings of the refresh operation and a diagram showing binary information.

FIG. 21 shows a semiconductor memory device in which the above refresh operation is effected. In this example, a semiconductor memory device 105 is divided into a plurality of memory sub-arrays with respect to emitter electrode lines. A clock $\phi$ output in a preset cycle from a time constant circuit 106 is supplied to an address counter circuit 107. In response to the clock $\phi$, the address counter circuit 107 supplies plural-bit addresses A0 to A3 to an emitter electrode line decoder/driver circuit 108 which in turn successively selects emitter electrode lines VE00 to VE33 in a preset cycle. The selection timings and binary information are shown in FIGS. 22A and 22B. As is clearly seen from the timing chart, when the emitter electrode lines VE00, VE01, - - -, VE33 are sequentially set to the "H (high)" level to "L (low)" level, the memory sub-arrays 00, 01, 02, - - -, 33 are sequentially refreshed in the "L" period of corresponding emitter electrode lines.

In the above example, since the whole memory array is divided into 16 memory sub-arrays, a through current flowing in the collector-emitter paths of the bipolar transistors of all the memory cells in the refresh operation becomes 1/16 of that flowing when the whole memory array is simultaneously refreshed. For example, assume that a 1-Mbit semiconductor memory device is constructed by using the above memory cells and data "1" is stored as memory data in all the memory cells. In this case, if a through current flowing in the collector-emitter path at the time of holding data "1" in the memory cell is 2.5 $\mu$A/cell, a through current of 2.5 A will flow in the refresh operation when all the memory cells are simultaneously refreshed. However, when the whole memory array is divided into 16 sub-arrays, the through current becomes 1/16 of 2.5 A or 156 mA. The through current in the refresh operation is reduced as the number of the divided memory sub-arrays increases. However, the average through current in the stand-by mode (or waiting mode) of the semiconductor memory device is mainly determined by an average through current flowing in the collector-emitter paths of the bipolar transistors of the memory cells the collector-emitter through current is determined by the duty ratio in the emitter clocking operation as described before, and the average through current is reduced to a value obtained by multiplying the duty ratio by a through current flowing when the emitter clocking operation is not effected.

FIGS. 23 and 24 show a concrete core circuit in which emitter electrode lines and word lines are arranged in parallel. In this circuit, the emitter electrode lines are independently selected in the readout operation and in the refresh operation. Therefore, the logical sum (OR) of a row address input from the exterior of the chip in a random fashion and an internal address output from the address counter for the refresh operation is derived, and the address of the thus derived logical sum is input to the emitter electrode decoder circuit. In this system, the emitter electrode lines commonly used in the refresh operation and readout operation can be simultaneously selected. When the semiconductor memory device of this invention is set in the same manner as the conventional DRAM, this embodiment can attain the required effect.

Figure 25:
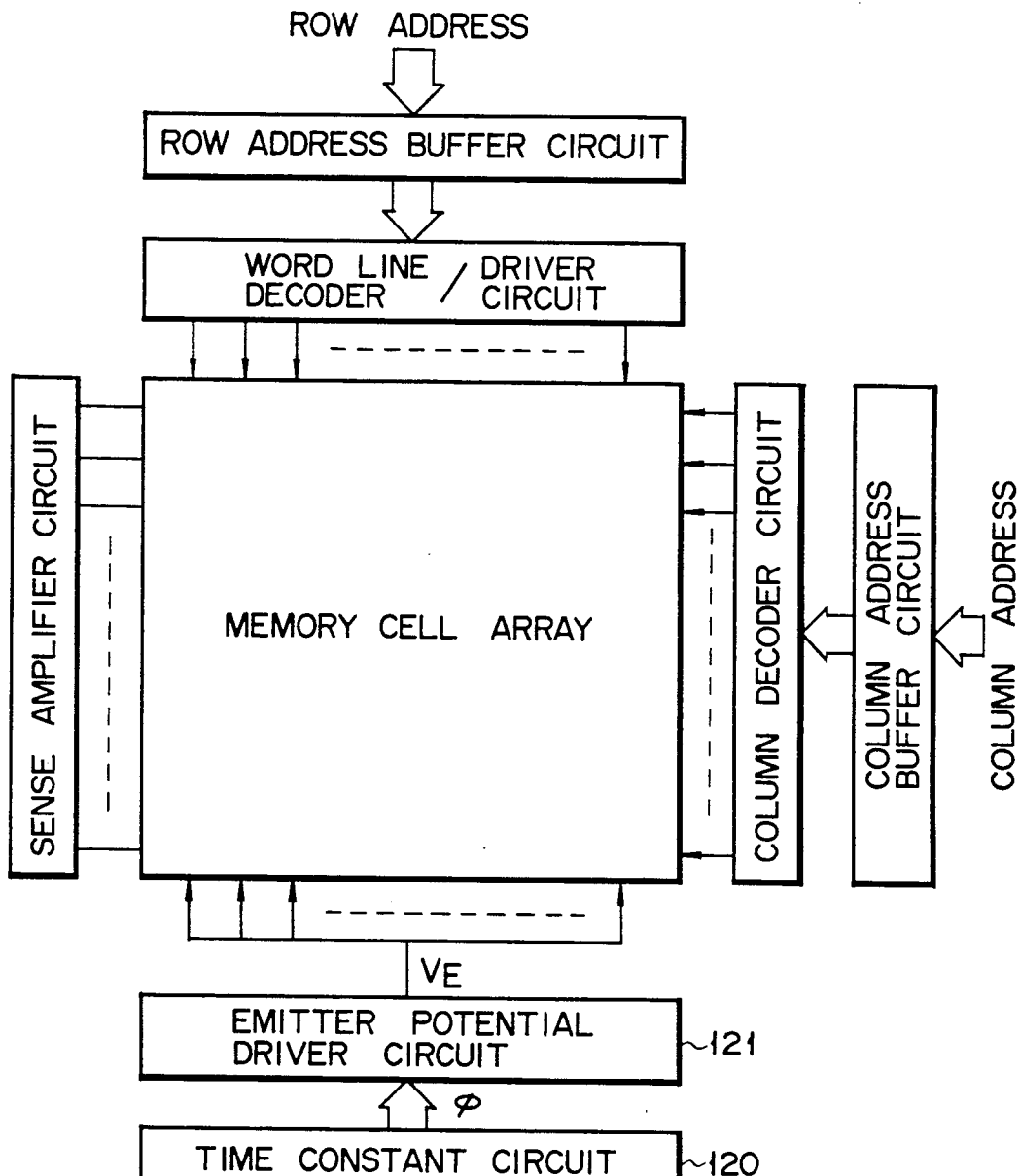
FIG. 25 is a block diagram of a semiconductor memory device according to another embodiment of this invention.

Next, another embodiment concerning the embodiment of FIG. 23 is explained with reference to FIG. 25.

Figure 26:
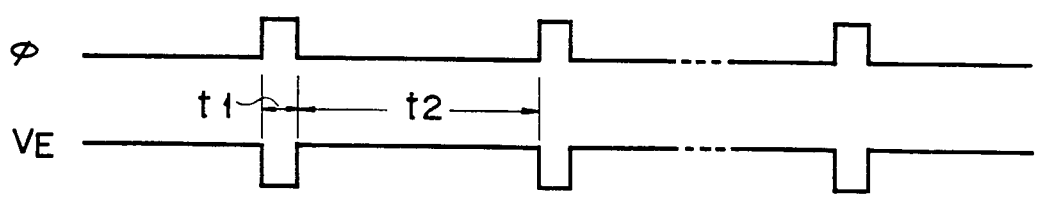
FIG. 26 is a timing chart showing the timings of refreshing the memory cell of FIG. 25.

According to this embodiment, a clock signal $\phi$ output from a time constant circuit 120 in a preset cycle is input to an emitter potential driver circuit 121. The emitter potential driver circuit 121 changes the emitter potential in response to the clock signal $\phi$. The timings set at this time are shown in FIG. 26. According to the timing chart, the base-emitter PN junction of a bipolar transistor of the memory cell is biased in the forward direction in a period t1 and the potential of the base which is the data storage node is refreshed. The base-emitter PN junction is biased in the reverse direction in a period t2 and the base node is set into the electrically floating condition. At this timing, the ratio of the period t1 to the entire period, that is, t1/(t1+t2) is called the duty ratio of the memory cell.

The average through current flowing in the collector-emitter path of a bipolar transistor of the memory cell is reduced to a value obtained by multiplying the duty ratio by a through current flowing when the emitter clocking operation is not effected. For example, when the duty ratio is 1/100, the average through current flowing in the collector-emitter path of the bipolar transistor is reduced to 1/100 of that flowing in a case wherein the emitter clocking operation is not effected. The duty ratio is determined by the pause time (data holding time) of the memory cell which is set in the electrically floating state.

FIG. 27 shows a concrete circuit of the above memory cell. In this circuit, when an NPN transistor is used as the bipolar transistor of the memory cell, the emitter potential is set to the "L (low)" level in the refresh operation and readout operation, and set to the "H (high)" level in the other time. This potential relation is reversed when a PNP transistor is used as the bipolar transistor.

According to this invention, a DRAM constructed by using the reverse base current characteristic of the bipolar transistor can be provided based on a new concept. That is, the bipolar transistor is activated in the readout mode and the DRAM cell is operated as a gain cell by the reverse base current. Since the DRAM cell is operated as a gain cell, it becomes different from the destructive readout type cell of the conventional DRAM, and the ratio $C_B/C_S$ of the bit line capacitance $C_B$ to the memory cell capacitance $C_S$ can be set larger than in the conventional case. That is, the number of memory cells which can be connected to one bit line can be increased in comparison with the conventional case.

Therefore, the array of high-density DRAM can be efficiently designed, the number of sense amplifiers can be reduced, and the chip area can be reduced.

Further, unlike the conventional DRAM, the sense amplifier is not operated by selecting the word line in the refresh mode, and according to this invention, the refresh operation can be completed simply by controlling the emitter potential irrespective of the selection/non-selection of the word line. Therefore, unlike the conventional DRAM, dead time for the refresh operation is not necessary and access to the memory cell can be made in a random fashion so that the user can use the semiconductor memory device of this invention in the same manner as an SRAM.

The average through current flowing in the collector-emitter path and contained in the average current flowing in the semiconductor memory device can be reduced to a value multiplied by the duty ratio, and thus the entire average current can be significantly reduced. Further, the memory cell array is divided into a plurality of sub-arrays and the refresh operation is sequentially effected for each sub-array so that the average through current flowing in the collector-emitter path in the refresh operation can be significantly reduced as the number of divided sub-arrays increases.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
a plurality of word lines;
a plurality of bit lines;
an array of memory cells each including a bipolar transistor which has a base, an emitter and a collector and a switching transistor connected between the base of said bipolar transistor and a corresponding one of said plurality of bit lines and controlled by a corresponding one of said plurality of word lines;
means for controlling a collector-emitter voltage applied to said bipolar transistor so that the polarity of a base current changes due to impact ionization as a base-emitter voltage applied to said bipolar transistor is increased and so that a potential corresponding to a base-emitter voltage at a boundary between forward and reverse base currents is used as a writing potential; and
voltage-variable means for varying an emitter voltage of a memory cell selected by one of said plurality of word lines to have the collector-emitter voltage higher in a memory cell data readout operation than in a case wherein the memory cell is not selected.

2. A semiconductor memory device according to claim 1, wherein said voltage means includes means for varying an emitter voltage applied to one of said memory cells which is selected by one of said word lines in synchronism with selection of said one of said plurality of word lines.

3. A semiconductor memory device according to claim 1, wherein an emitter electrode of said bipolar transistor and a corresponding one of the plurality of word lines connected to said memory cells are connected together.

4. A semiconductor memory device comprising:
a plurality of word lines;
a plurality of bit lines;
an array of memory cells each including a bipolar transistor which has a base, an emitter and a collector and a switching transistor connected between the base of said bipolar transistor and a corresponding one of said plurality of bit lines and controlled by a corresponding one of said plurality of word lines;
means for controlling a collector-emitter voltage applied to said bipolar transistor so that the polarity of a base current changes due to impact ionization as a base-emitter voltage applied to said bipolar transistor is increased and so that a potential corresponding to a base-emitter voltage at a boundary between forward and reverse base currents is used as a writing potential;
voltage-variable means for varying an emitter voltage of a memory cell selected by one of said plurality of word lines to have the collector-emitter voltage higher in a memory cell data readout operation than in a case wherein the memory cell is not selected; and a plurality of emitter electrode lines arranged in parallel with said word lines, each emitter electrode line being selectable by an address.

5. A semiconductor memory device according to claim 4, wherein said voltage-variable means includes a decoder circuit for selecting said plurality of emitter electrode lines and a driver circuit for inputting a signal to said plurality of emitter electrode lines.

6. A semiconductor memory device according to claim 4, wherein all of said word lines are kept in the non-selected state for completely refreshing said memory cells.

7. A semiconductor memory device according to claim 4, wherein a first number of the plurality of emitter electrode lines selected in a refresh operation for refreshing said plurality of memory cells is larger than a second number of the plurality of emitter electrode lines selected in a write-in or readout operation with respect to said plurality of memory cells.

8. A semiconductor memory device according to claim 4, wherein a number of said plurality of emitter electrode lines intersecting said plurality of bit lines are selected in a refresh operation for refreshing said plurality of memory cells to simultaneously effect the refresh operation.

9. A semiconductor memory device according to claim 4, wherein said plurality of word lines are formed of first-layered polysilicon electrode lines and said plurality of emitter electrode lines are formed of second-layered polysilicon electrodes.

10. A semiconductor memory device comprising:
a plurality of word lines;
a plurality of bit lines;
a memory cell array including a plurality of memory cells arranged in a matrix form, each memory cell including a bipolar transistor which has a base, an emitter, a collector, and a PN junction between the base and the emitter and a switching transistor connected between the base of said bipolar transistor and a corresponding one of said plurality of bit lines and controlled by a corresponding one said plurality of word lines;
means for controlling a collector-emitter voltage applied to said bipolar transistor so that the polarity of a base current changes due to impact ionization as a base-emitter voltage applied to said bipolar transistor is increased and so that a potential corresponding to a base-emitter voltage at a boundary between forward and reverse base currents is used as a writing potential;
voltage-variable means for varying an emitter voltage of each memory cell so as to set the PN junction between the base and emitter of said bipolar transistor into a forward bias state for a preset period of time at least once in a predetermined cycle irrespective of whether said plurality of word lines are selected or non-selected; and
a plurality of emitter electrode lines, each emitter electrode line being selectable by an address.

11. A semiconductor memory device according to claim 10, further including means for writing data into said plurality of memory cells in said memory cell array and refreshing said plurality of memory cells.

12. A semiconductor memory device according to claim 10, wherein said memory cell array is divided into a plurality of sub-arrays, all the emitters of bipolar transistors of memory cells in each of said sub-arrays are commonly connected to a corresponding one of said plurality of emitter electrode lines, and which further includes means provided for each emitter electrode line, for refreshing said plurality of sub-arrays in a preset cycle.

13. A semiconductor memory device according to claim 10, wherein said semiconductor memory device has address generating means for generating an internal address, and said plurality of emitter electrode lines are arranged in parallel with said plurality of word lines, and which includes means for selecting only said plurality of emitter electrode lines according to the internal address generated from said address generation means of said semiconductor memory device in a data readout operation.

14. A semiconductor memory device according to claim 13, wherein said address generation means of said semiconductor memory device includes a time constant circuit; and an address counter circuit for receiving a clock pulse output from said time constant circuit at a regular interval.

15. A semiconductor memory device according to claim 13, further comprising means for simultaneously selecting ones of said plurality of emitter electrode lines according to the internal address and an external address so as to effect a refresh operation and a readout/write-in operation independently from each other.

16. A semiconductor memory device according to claim 13, wherein said address generation means of said semiconductor memory device includes a time constant circuit; and a shift register circuit for receiving a clock pulse output from said time constant circuit at a regular interval.

17. A semiconductor memory device comprising:
a plurality of word lines;
a plurality of bit lines;
a memory cell array including a plurality of memory cells arranged in a matrix form, each memory cell including a bipolar transistor which has a base, an emitter, a collector, and a PN junction between the base and the emitter and a switching transistor connected between the base of said bipolar transistor and a corresponding one of said plurality of bit lines and controlled by a corresponding one said plurality of word lines;
means for controlling a collector-emitter voltage applied to said bipolar transistor so that the polarity of a base current changes due to impact ionization as a base-emitter voltage applied to said bipolar transistor is increased and so that a potential corresponding to a base-emitter voltage at a boundary between forward and reverse base currents is used as a writing potential; and
voltage-variable means for varying an emitter voltage applied to each of said plurality of memory cells so as to set the PN junction between the base and emitter of said bipolar transistor into a forward bias state for a preset period of time at least once in a predetermined cycle.

18. A semiconductor memory device according to claim 17, further comprising means for setting a base-emitter path of respective memory cells into a non-conductive state while data is held.

19. A semiconductor memory device according to claim 17, wherein said voltage-variable means includes means for refreshing said plurality of memory cells by setting the PN junction between the base and emitter of said bipolar transistor into the forward bias state for a preset period of time at least once in a predetermined cycle.

20. A semiconductor memory according to claim 19, wherein said semiconductor memory device is formed on a semiconductor chip having a timer circuit, a refresh operation for refreshing said memory cells is effected independently from a write-in and readout operation of said plurality of memory cells, and the PN junction between the base and emitter of said bipolar transistor is biased in a forward direction by a clock pulse generated once in a preset cycle from said timer circuit.

21. A semiconductor memory device according to claim 19, further comprising means for simultaneously refreshing a number of said plurality of memory cells or all of said plurality of memory cells.

* * * * *